(12) United States Patent
Choi et al.

(10) Patent No.: US 10,790,282 B2
(45) Date of Patent: Sep. 29, 2020

(54) SEMICONDUCTOR DEVICES

(71) Applicant: Samsung Electronics Co., Ltd., Suwon-si (KR)

(72) Inventors: Soo-Jung Choi, Seoul (KR); Dong-Hyun Roh, Suwon-si (KR); Sung-Soo Kim, Hwaseong-si (KR); Gyu-Hwan Ahn, Gunpo-si (KR); Sang-Jin Hyun, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/229,207

(22) Filed: Dec. 21, 2018

(65) Prior Publication Data
US 2020/0020691 A1 Jan. 16, 2020

(30) Foreign Application Priority Data

Jul. 12, 2018 (KR) .................... 10-2018-0081124

(51) Int. Cl.
*H01L 27/092* (2006.01)
*H01L 21/8238* (2006.01)
*H01L 29/06* (2006.01)
*H01L 29/66* (2006.01)
*H01L 29/78* (2006.01)
*H01L 29/423* (2006.01)
*H01L 21/308* (2006.01)

(52) U.S. Cl.
CPC ...... *H01L 27/0924* (2013.01); *H01L 21/3086* (2013.01); *H01L 21/823821* (2013.01); *H01L 21/823864* (2013.01); *H01L 21/823878* (2013.01); *H01L 29/0649* (2013.01); *H01L 29/42356* (2013.01); *H01L 29/66545* (2013.01); *H01L 29/66795* (2013.01); *H01L 29/7851* (2013.01)

(58) Field of Classification Search
CPC ............ H01L 27/0924; H01L 21/3086; H01L 21/823821; H01L 21/823864; H01L 21/823878; H01L 29/0649; H01L 29/42356; H01L 29/66545; H01L 29/66795; H01L 29/7851
USPC ....................................................... 257/288
See application file for complete search history.

(56) References Cited

U.S. PATENT DOCUMENTS

| 9,070,577 | B2 | 6/2015 | Lee |
| 9,385,192 | B2 | 7/2016 | Shen et al. |
| 9,455,204 | B1 | 9/2016 | Cao et al. |
| 9,853,029 | B2 | 12/2017 | You et al. |

(Continued)

FOREIGN PATENT DOCUMENTS

JP 2013-235889 A 11/2013

*Primary Examiner* — Tong-Ho Kim
(74) *Attorney, Agent, or Firm* — Muir Patent Law, PLLC

(57) ABSTRACT

A semiconductor device may include active fins spaced apart from each other by a recess therebetween, each of the active fins protruding from an upper surface of a substrate, an isolation structure including a liner on a lower surface and a sidewall of a lower portion of the recess and a blocking pattern on the liner, the blocking pattern filling a remaining portion of the lower portion of the recess and including a nitride, a carbide or polysilicon, a gate electrode structure on the active fins and the isolation structure, and a source/drain layer on a portion of each of the active fins adjacent to the gate electrode structure.

14 Claims, 38 Drawing Sheets

(56) References Cited

U.S. PATENT DOCUMENTS

| | | |
|---|---|---|
| 9,870,956 B2 | 1/2018 | Chen et al. |
| 9,881,918 B1 | 1/2018 | Huang et al. |
| 2005/0145932 A1* | 7/2005 | Park .................. H01L 29/66795 |
| | | 257/328 |
| 2016/0163700 A1 | 6/2016 | Peng et al. |
| 2017/0148685 A1 | 5/2017 | Cheng et al. |
| 2017/0148914 A1 | 5/2017 | Lee et al. |
| 2017/0162696 A1 | 6/2017 | Lee et al. |
| 2017/0221770 A1 | 8/2017 | Chung et al. |
| 2017/0250282 A1* | 8/2017 | Wu ..................... H01L 29/7848 |
| 2017/0352728 A1 | 12/2017 | Lee et al. |

* cited by examiner

SEMICONDUCTOR DEVICES

CROSS-REFERENCE TO RELATED APPLICATION

This application claims the benefit of priority under 35 U.S.C. § 119 to Korean Patent Application No. 10-2018-0081124, filed Jul. 12, 2018, in the Korean Intellectual Property Office (KIPO), the contents of which are herein incorporated by reference in their entirety.

BACKGROUND

1. Field

Example embodiments relate to a semiconductor device. More particularly, example embodiments relate to a finFET.

2. Description of the Related Art

As the thickness of a gate spacer on a sidewall of a gate structure gradually decreases, a source/drain layer that is insulated from the gate structure by the gate spacer may be electrically shorted with the gate structure. Accordingly, a method of preventing the electrical short is provided.

SUMMARY

Example embodiments provide a semiconductor device having improved characteristics.

According to some aspects, the disclosure is directed to a semiconductor device, comprising: first and second active fins spaced apart from each other by a recess therebetween, each of the first and second active fins protruding from an upper surface of a substrate; an isolation structure formed within the recess including: a liner on a lower surface and a sidewall of a lower portion of the recess; and a blocking pattern on the liner, the blocking pattern filling a remaining portion of the lower portion of the recess and including a nitride, a carbide, or polysilicon; a gate electrode structure on the first and second active fins and the isolation structure; and a source/drain layer on a portion of each of the first and second active fins adjacent to the gate electrode structure.

According to some aspects, the disclosure is directed to a semiconductor device, comprising: an active fin protruding from an upper surface of a substrate and including a lower active pattern and an upper active pattern stacked on the lower active pattern; an isolation structure including: a liner on a sidewall of the lower active pattern and the upper surface of the substrate; and a blocking pattern on the liner, the blocking pattern surrounding the sidewall of the lower active pattern and including a nitride, a carbide, or polysilicon; a gate electrode structure on the upper active pattern and the isolation structure; and a source/drain layer on a portion of the active fin adjacent to the gate electrode structure, wherein an entire lower surface of the gate electrode structure is covered by the upper active pattern, the liner, and the blocking pattern.

According to some aspects, the disclosure is directed to a semiconductor device, comprising: first active fins spaced apart from each other by a first recess therebetween, the first recess including a central portion having a lower surface lower than a lower surface of an edge portion thereof, each of the first active fins protruding from a first region of a substrate including the first region and a second region; second active fins spaced apart from each other by a second recess therebetween, the second recess including a central portion having a lower surface lower than a lower surface of an edge portion thereof, each of the second active fins protruding from the second region of the substrate; a first isolation structure including: a first insulation pattern filling a lower portion of the edge portion of the first recess; and a stress structure filling a lower portion of the central portion of the first recess, the stress structure containing a third insulation pattern and a liner, the liner covering a lower surface and a sidewall of the third insulation pattern; a second isolation structure including: a second insulation pattern filling a lower portion of the edge portion of the second recess; and a fourth insulation pattern filling a lower portion of the central portion of the second recess; a first gate electrode structure on the first active fins and the first isolation structure; a second gate electrode structure on the second active fins and the second isolation structure; a first source/drain layer on a portion of each of the first active fins adjacent to the first gate electrode structure; and a second source/drain layer on a portion of each of the second active fins adjacent to the second gate electrode structure.

In a semiconductor device in accordance with example embodiments, a gate electrode structure and a source/drain layer adjacent to the gate electrode structure may not contact each other, but may be spaced apart from each other by an isolation structure and a gate spacer, so that an electrical short may not occur between the gate electrode structure and the source/drain layer.

However, the effects of the present invention may not be limited to the above-described effects, and may be variously extended without departing from the scope of the present invention.

DETAILED DESCRIPTION

A semiconductor device in accordance with example embodiments will be described more fully hereinafter with reference to the accompanying drawings.

FIGS. 1 to 22 are plan views and cross-sectional views illustrating stages of a method of manufacturing a semiconductor device in accordance with example embodiments. Particularly, FIGS. 1, 6, 9, 12, 15, and 18 are plan views, and FIGS. 2-5, 7-8, 10-11, 13-14, 16-17, and 19-22 are cross-sectional views.

Figure 7:
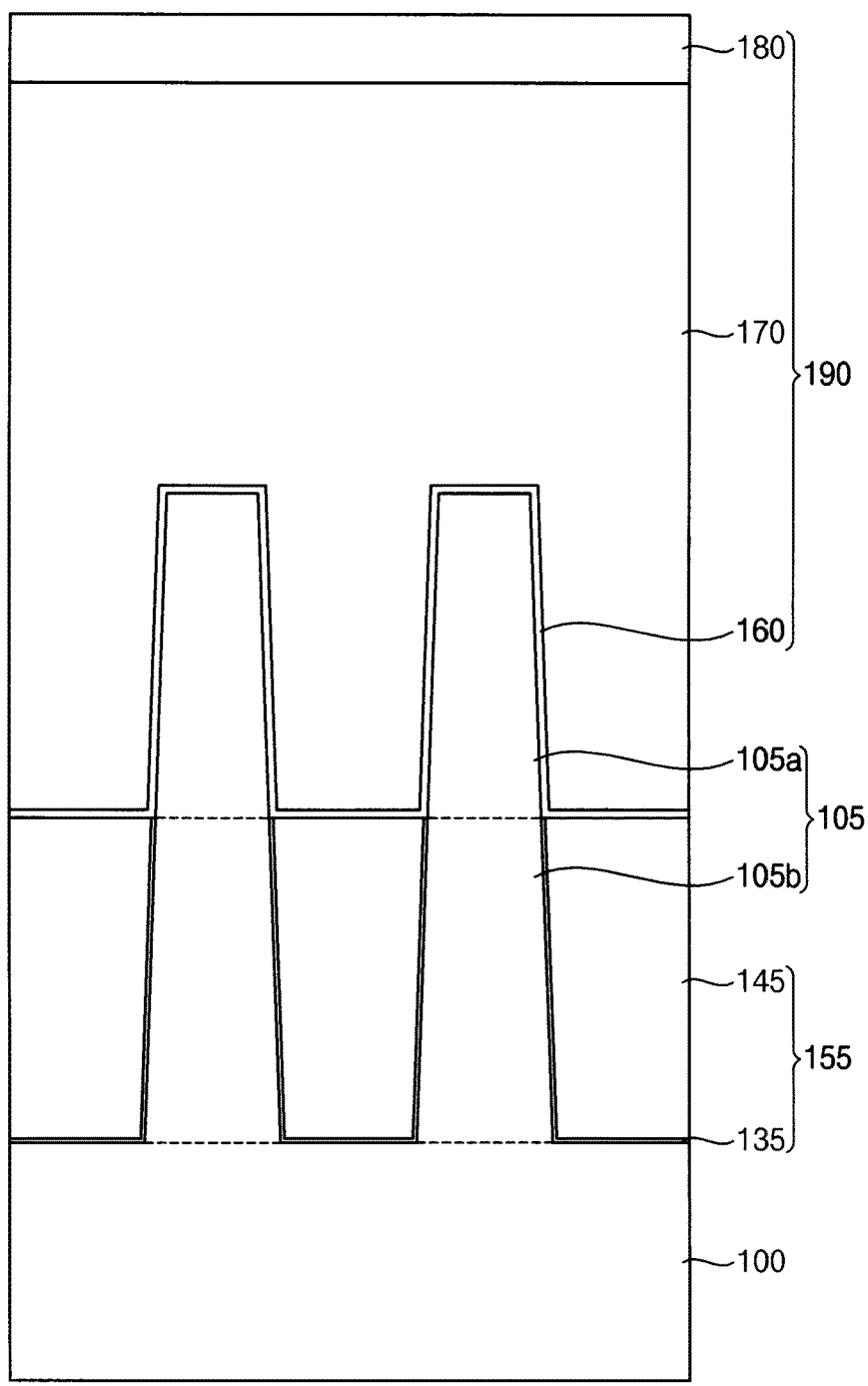
Figure 16:
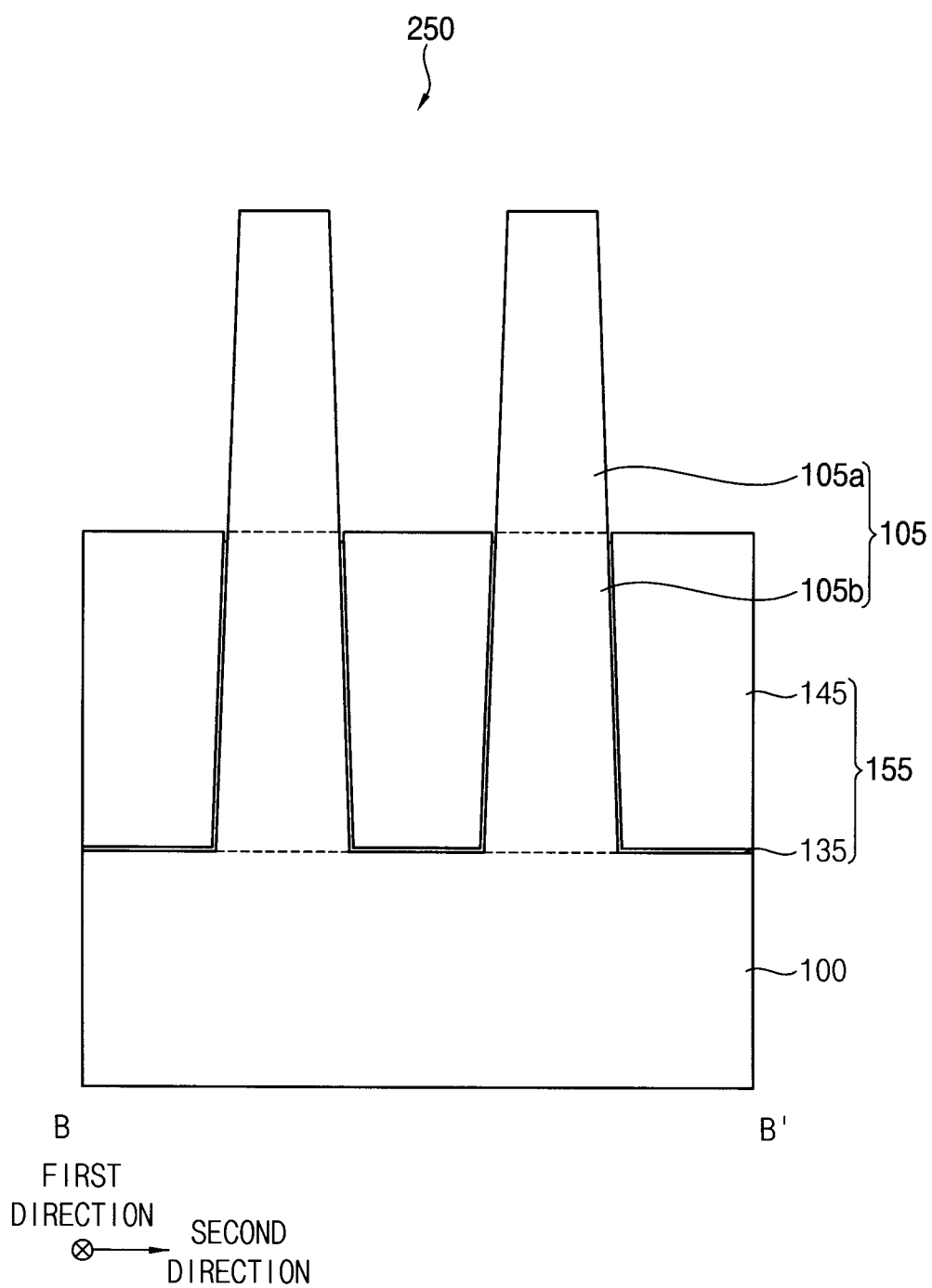
Figure 20:
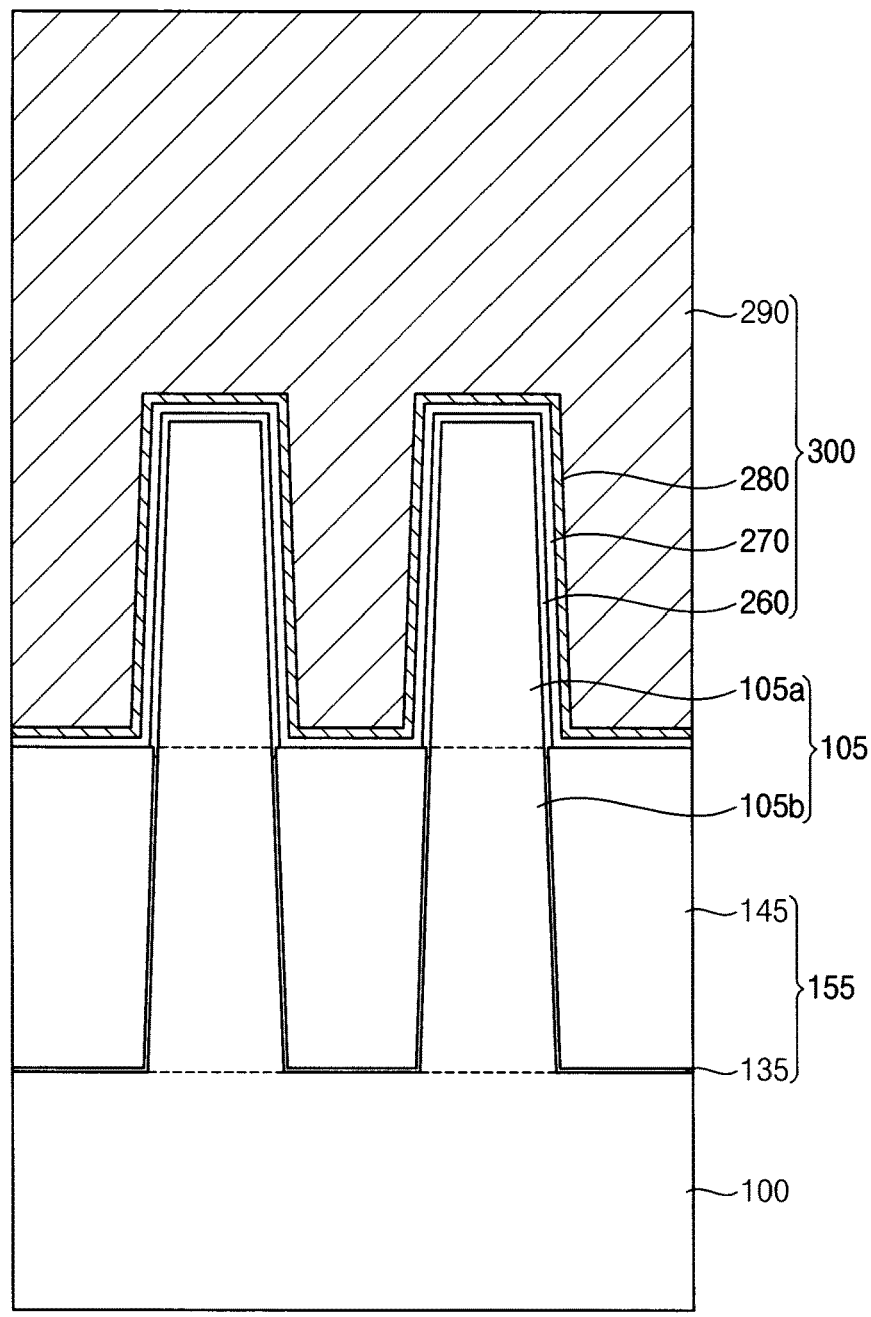
Figure 21:
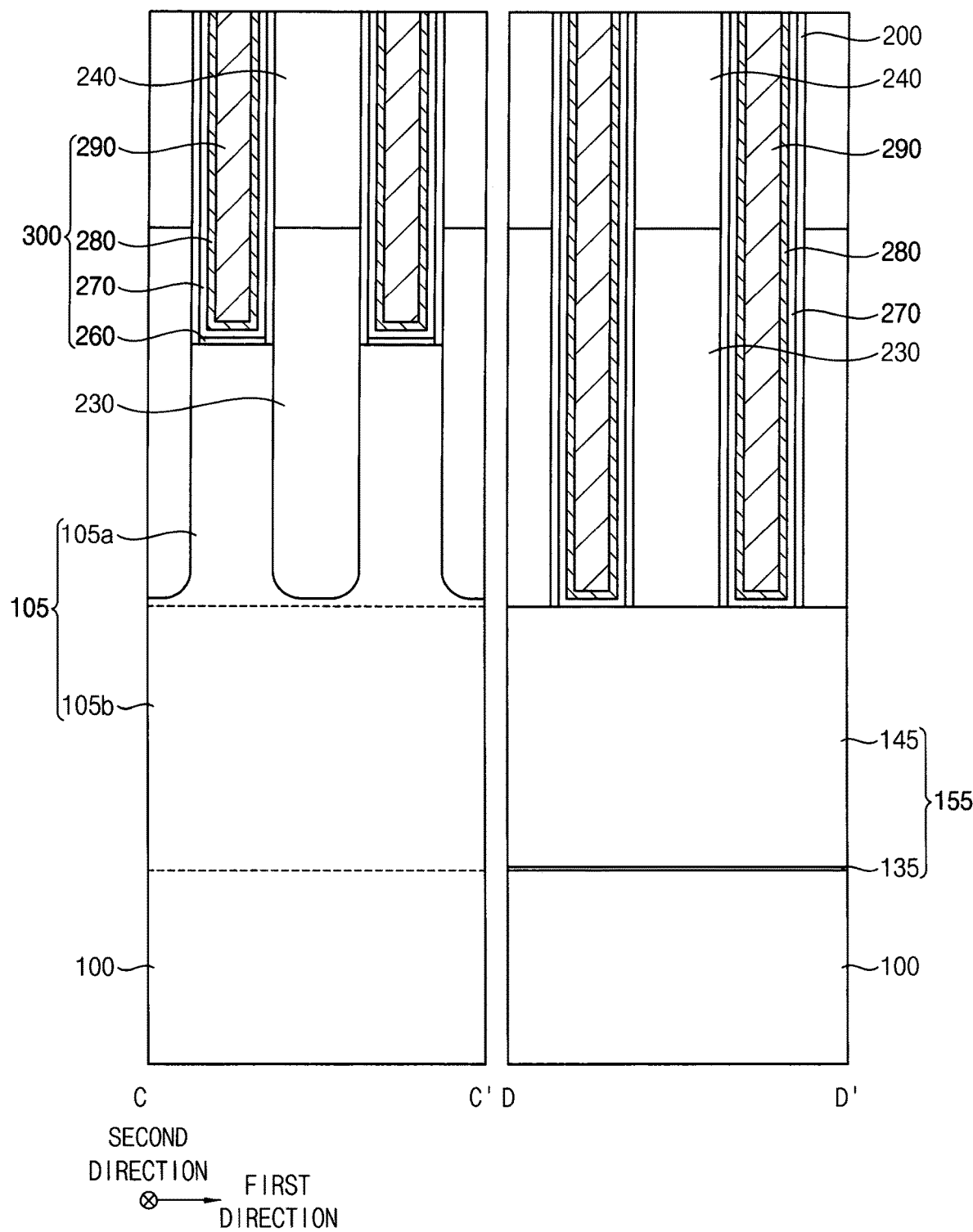

FIGS. 2 to 5, 10, 13, and 19 are cross-sectional views taken along lines A-A' of corresponding plan views, respectively, FIGS. 7, 16, and 20 are cross-sectional views taken along lines B-B' of corresponding plan views, respectively, and FIGS. 8, 11, 14, 17, 21, and 22 include cross-sectional views taken along lines C-C' and lines D-D' of corresponding plan views, respectively.

Figure 1:
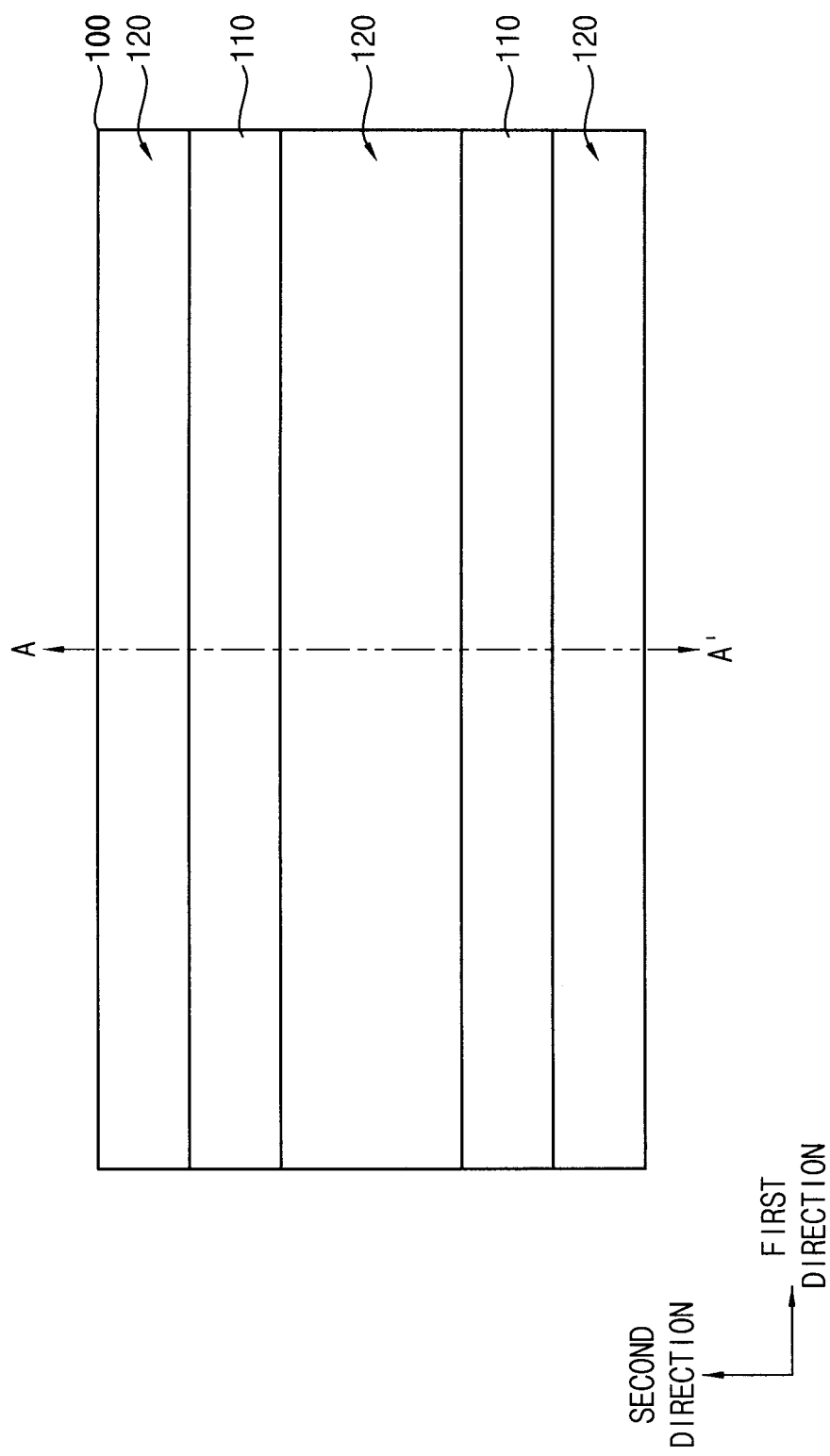
FIGS. 1 to 22 are plan views and cross-sectional views illustrating stages of a method of manufacturing a semiconductor device in accordance with example embodiments.
Figure 2:
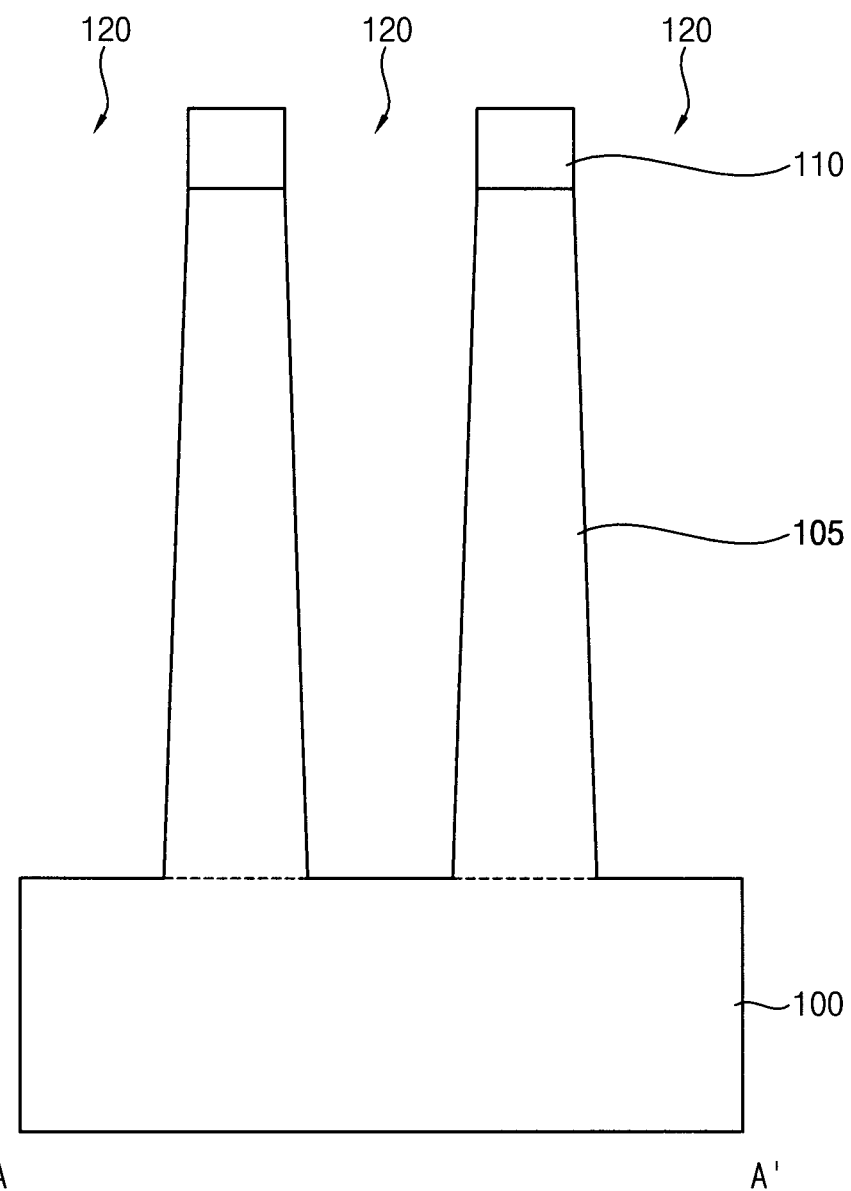

Referring to FIGS. 1 and 2, an upper portion of a substrate 100 may be partially etched to form a first active fin 105. Accordingly, the first active fin 105 may protrude in a vertical direction substantially perpendicular to an upper surface of the substrate 100, and may include the same material as that of the substrate 100. The vertical direction may be a third direction that is substantially orthogonal to both a first direction and a second direction.

The substrate 100 may include semiconductor materials, e.g., silicon, germanium, silicon-germanium, etc., or III-V compounds e.g., GaP, GaAs, GaSb, etc. In some embodiments, the substrate 100 may be a silicon-on-insulator (SOI) substrate or a germanium-on-insulator (GOI) substrate.

In example embodiments, after forming a first mask 110 on the substrate 100, the upper portion of the substrate 100 may be etched using the first mask 110 as an etching mask to form the first active fin 105. The first active fin 105 may extend lengthwise in a first direction substantially parallel to the upper surface of the substrate 100, and a plurality of first active fins 105 may be formed in a second direction substantially parallel to the upper surface of the substrate 100 and intersecting with the first direction. In example embodiments, the first and second directions may be orthogonal to each other.

A first recess 120 may be formed between the first active fins 105 and extend lengthwise in the second direction. For example, the first active fins 105 may be spaced apart from each other in the second direction by the first recess 120.

Figure 3:
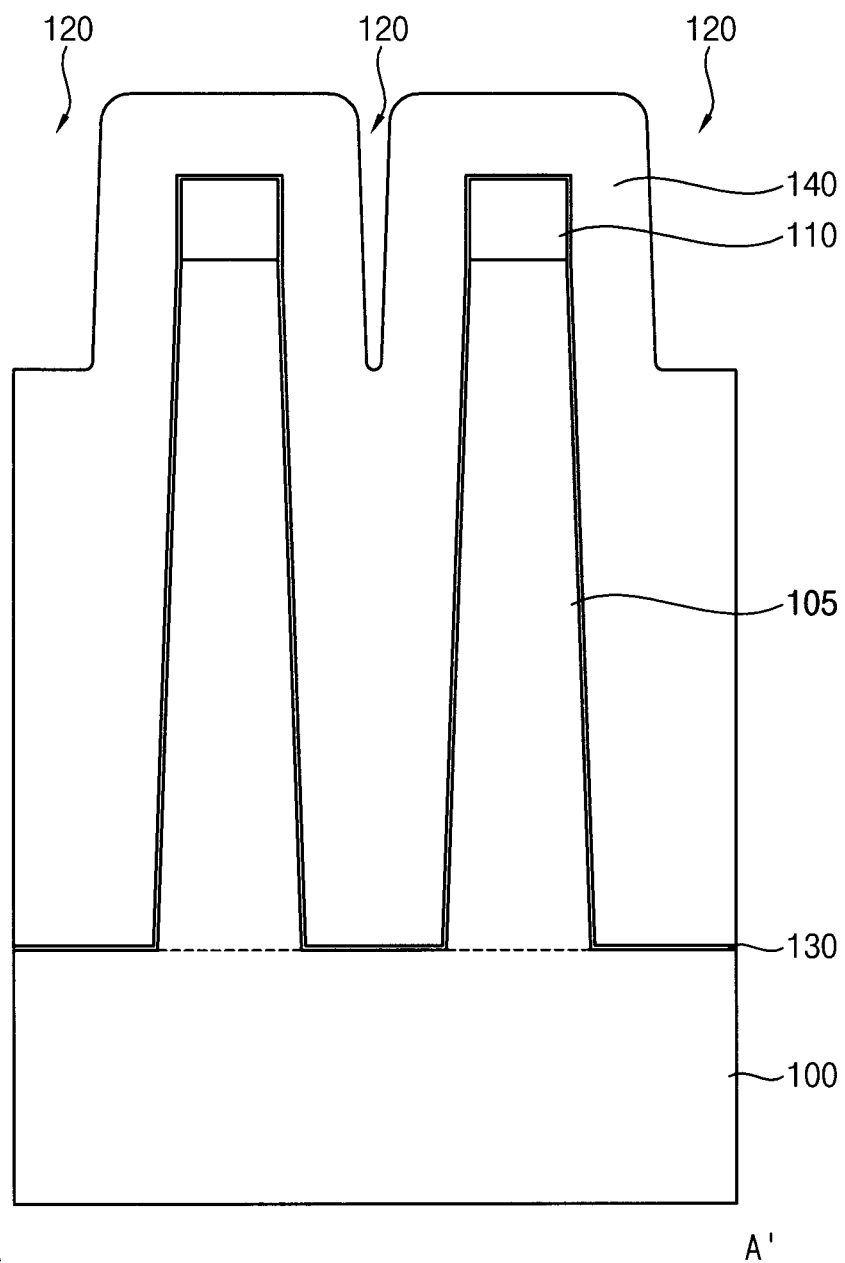

Referring to FIG. 3, a first liner layer 130 may be formed on the first active fin 105, the first mask 110, and the substrate 100. After forming the first liner layer 130, a blocking layer 140 may be formed on the first liner layer 130 to partially or entirely fill the first recess 120. The first liner layer 130 may be conformally formed on the surfaces on which it is deposited.

In example embodiments, the first liner layer 130 may include an oxide, e.g., silicon oxide, and may be conformally formed on the first active fin 105, the first mask 110, and the substrate 100. In some embodiments, the first liner layer 130 may have a substantially uniform thickness across the first active fin 105, the first mask 110, and the substrate 100. The first liner layer 130 may increase the adhesion between the blocking layer 140 and the first active fin 105, and thus may be formed to have a small thickness.

In example embodiments, the blocking layer 140 may include a material having a high etching selectivity with respect to an oxide, e.g., a nitride such as silicon nitride, a carbide such as silicon carbide, polysilicon, etc. The blocking layer 140 may be formed to fill at least a lower portion of the first recess 120. For example, the blocking layer 140 may completely fill more than half of the portion of the first recess 120 between adjacent first active fins 105.

Figure 4:
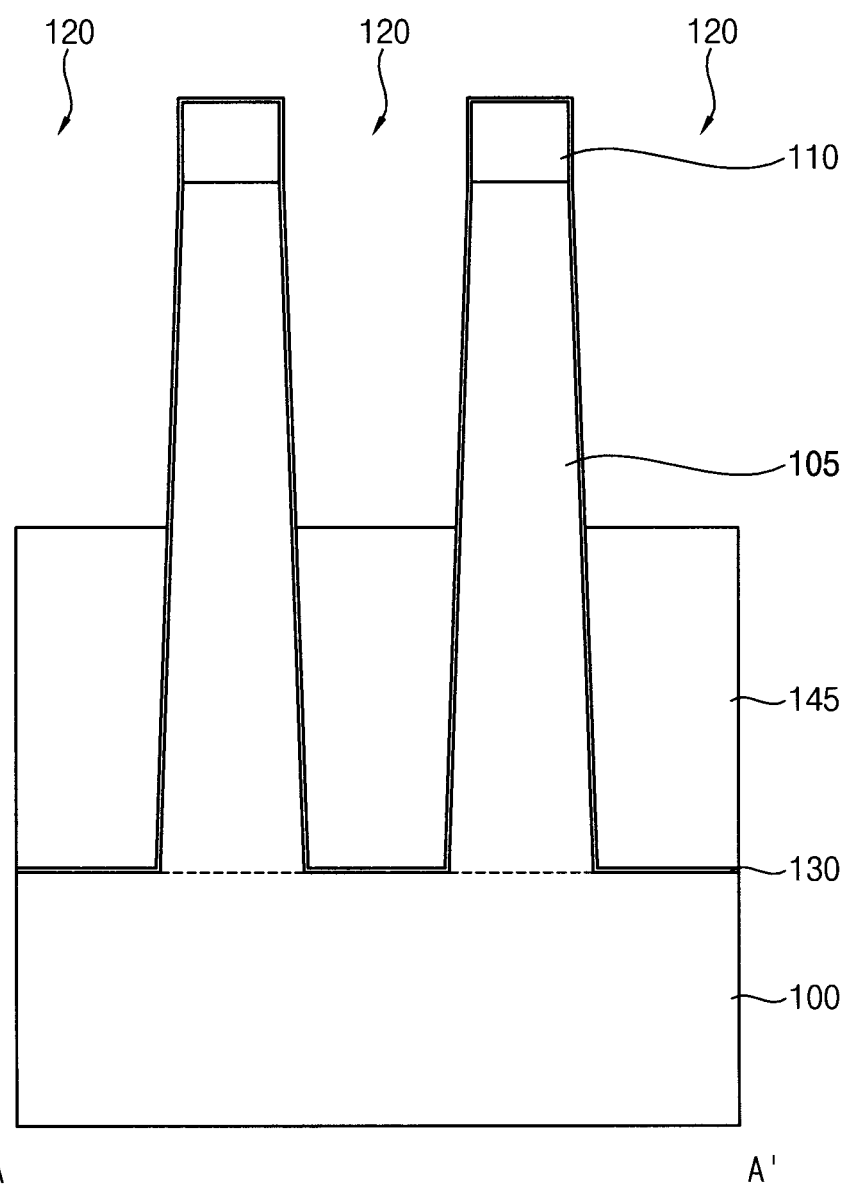

Referring to FIG. 4, an upper portion of the blocking layer 140 may be removed to form a blocking pattern 145 filling the lower portion of the first recess 120.

As the blocking pattern 145 is formed, an upper portion of the first liner layer 130 may be exposed. For example, the first liner layer 130 may be exposed along the side surfaces of upper portions of the first active fins 105 and the top and side surfaces of the first mask 110. The upper portion of the blocking layer 140 may be removed by, e.g., an etch back process.

Figure 5:
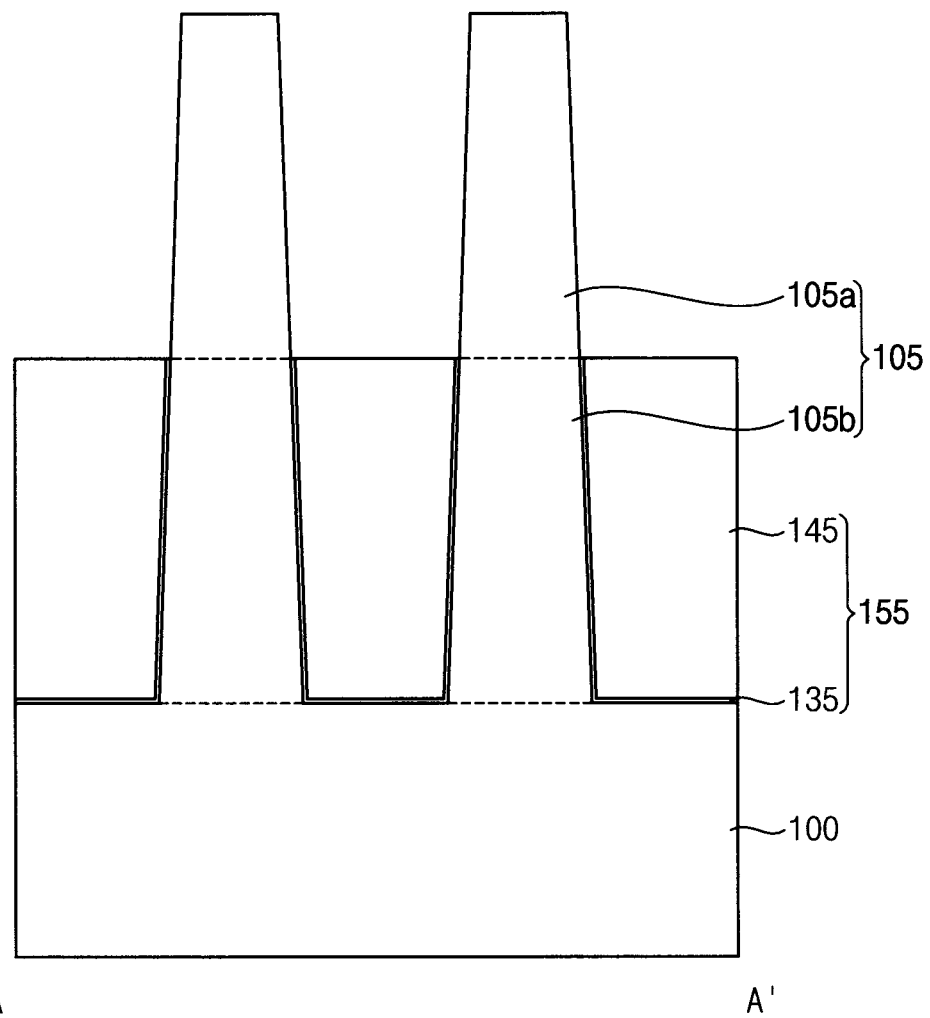

Referring to FIG. 5, after forming a sacrificial layer (not shown) on the first liner layer 130 to fill an upper portion of the first recess 120, the sacrificial layer may be planarized until an upper surface of the first active fin 105 may be exposed.

The sacrificial layer may include an oxide, e.g., silicon oxide. In example embodiments, the planarization process may be performed by a chemical mechanical polishing (CMP) process. In the planarization process, the first mask 110 and a portion of the first liner layer 130 on a surface of the first mask 110 may be removed entirely.

The sacrificial layer may be removed to expose an upper surface of the blocking pattern 145 thereunder. In example embodiments, the sacrificial layer may be removed by an etch back process, and a portion of the first liner layer 130 covering an upper sidewall of the first active fin 105 may also be removed together with the sacrificial layer to form a first liner 135 covering a lower sidewall of the first active fin 105 and the upper surface of the substrate 100. The first liner 135 and the blocking pattern 145, sequentially stacked and filling the lower portion of the first recess 120, may form a first isolation structure 155.

The first active fin 105 may include a first lower active pattern 105b of which a sidewall may be surrounded by the first isolation structure 155, and a first upper active pattern 105a protruding from an upper surface of the first isolation structure 155 in the vertical direction.

Figure 6:
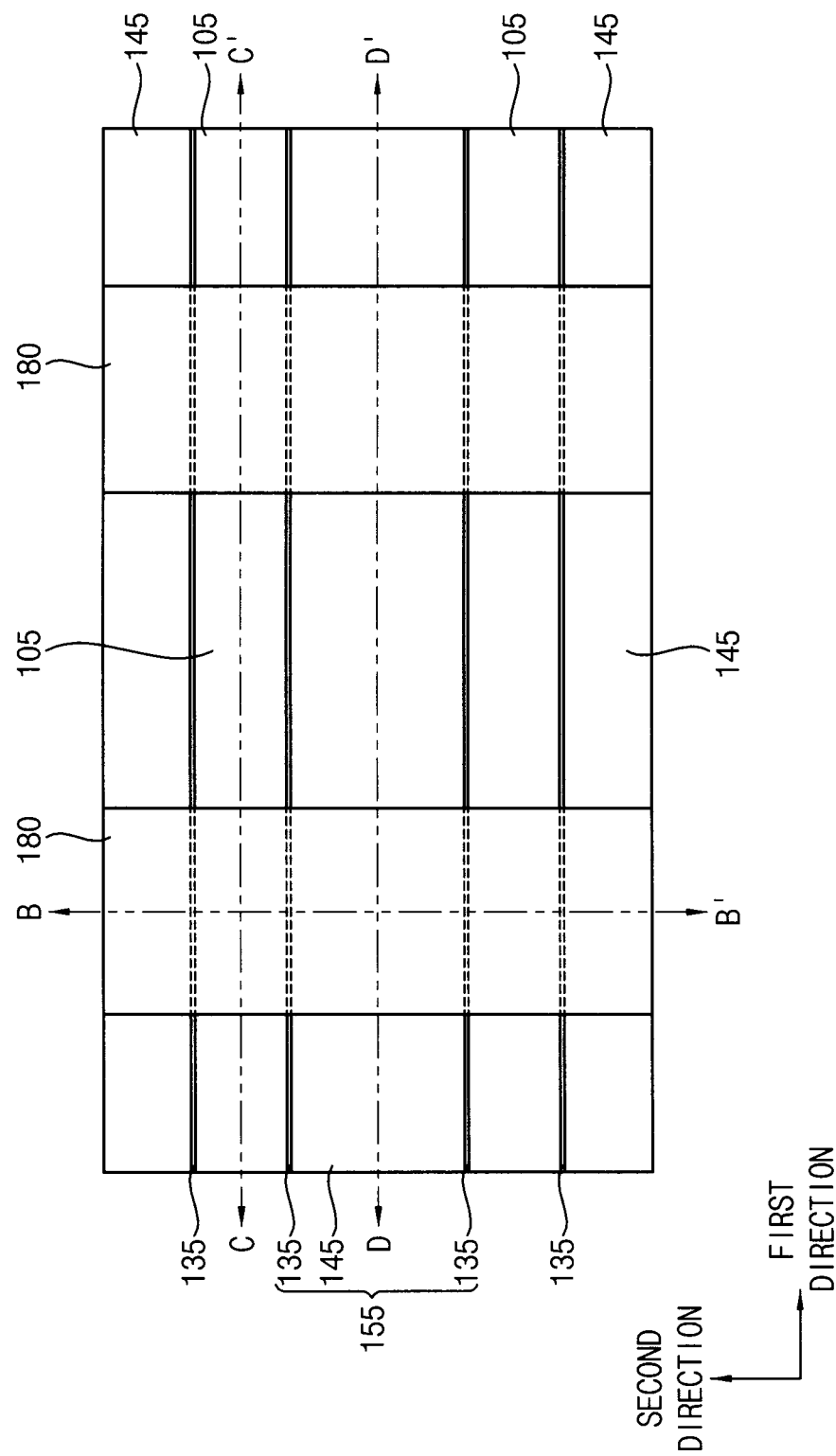
Figure 8:
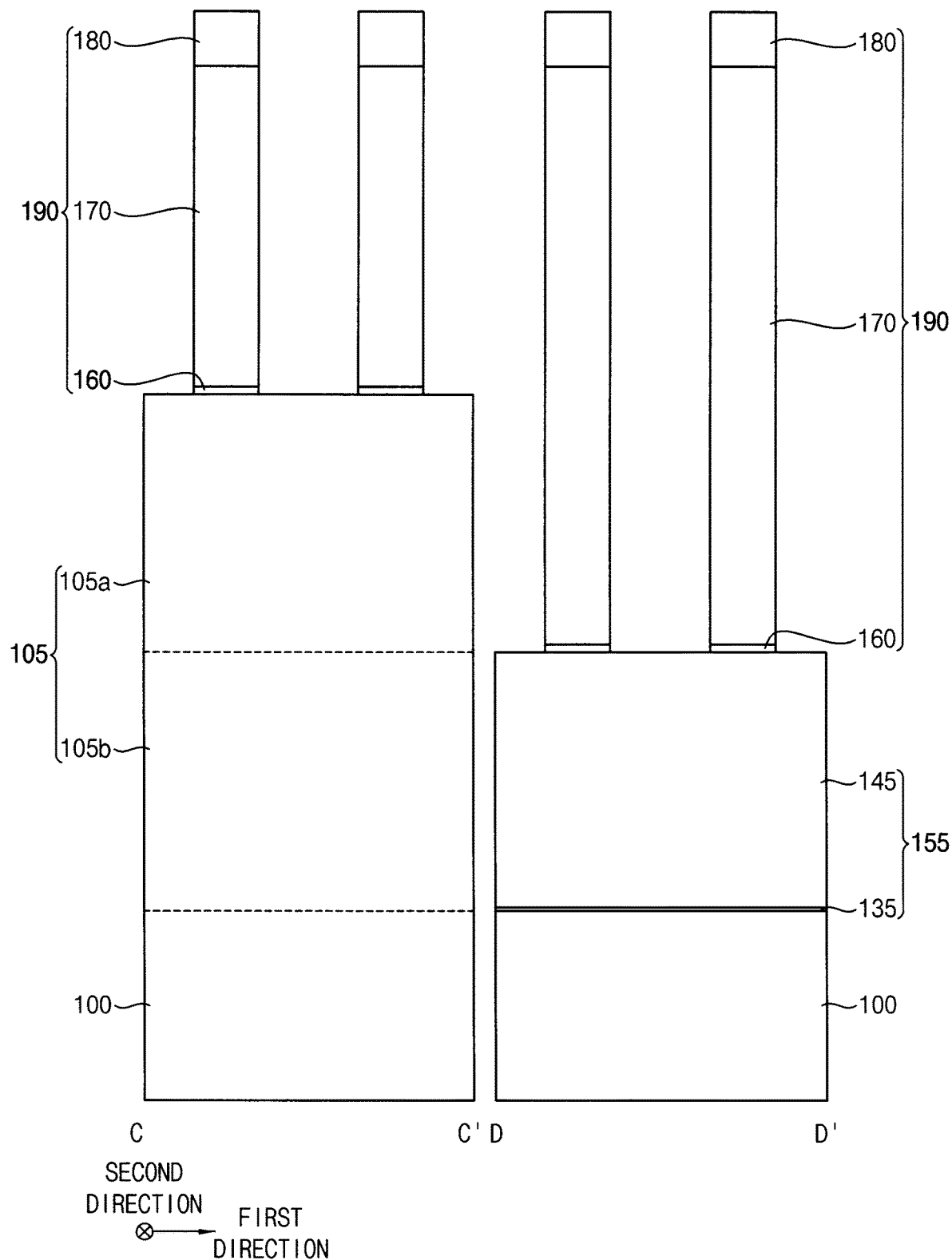

Referring to FIGS. 6 to 8, a dummy gate structure 190 may be formed on the first active fin 105 and the first isolation structure 155.

A dummy gate insulation layer, a dummy gate electrode layer and a dummy gate mask layer may be sequentially formed on the first active fin 105 and the first isolation structure 155, the dummy gate mask layer may be patterned to form a dummy gate mask 180, and the dummy gate electrode layer and the dummy gate insulation layer may be sequentially etched using the dummy gate mask 180 as an etching mask to form the dummy gate structure 190.

Accordingly, the dummy gate structure 190 including a dummy gate insulation pattern 160, a dummy gate electrode 170, and the dummy gate mask 180 sequentially stacked may be formed on the substrate 100.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate insulation layer may be formed by, e.g., a chemical vapor deposition (CVD) process, an atomic layer deposition (ALD) process, etc. Alternatively, the dummy gate insulation layer may be formed by performing a thermal oxidation process on the first upper active pattern 105a of the first active fin 105, and in this case, the dummy gate insulation layer may be formed only on an upper surface of the first upper active pattern 105a. The dummy gate electrode layer and the dummy gate mask layer may be also formed by, e.g., a CVD process, an ALD process, etc.

In example embodiments, the dummy gate structure 190 may extend lengthwise in the second direction, and a plurality of dummy gate structures 190 may be formed in the first direction.

Figure 9:
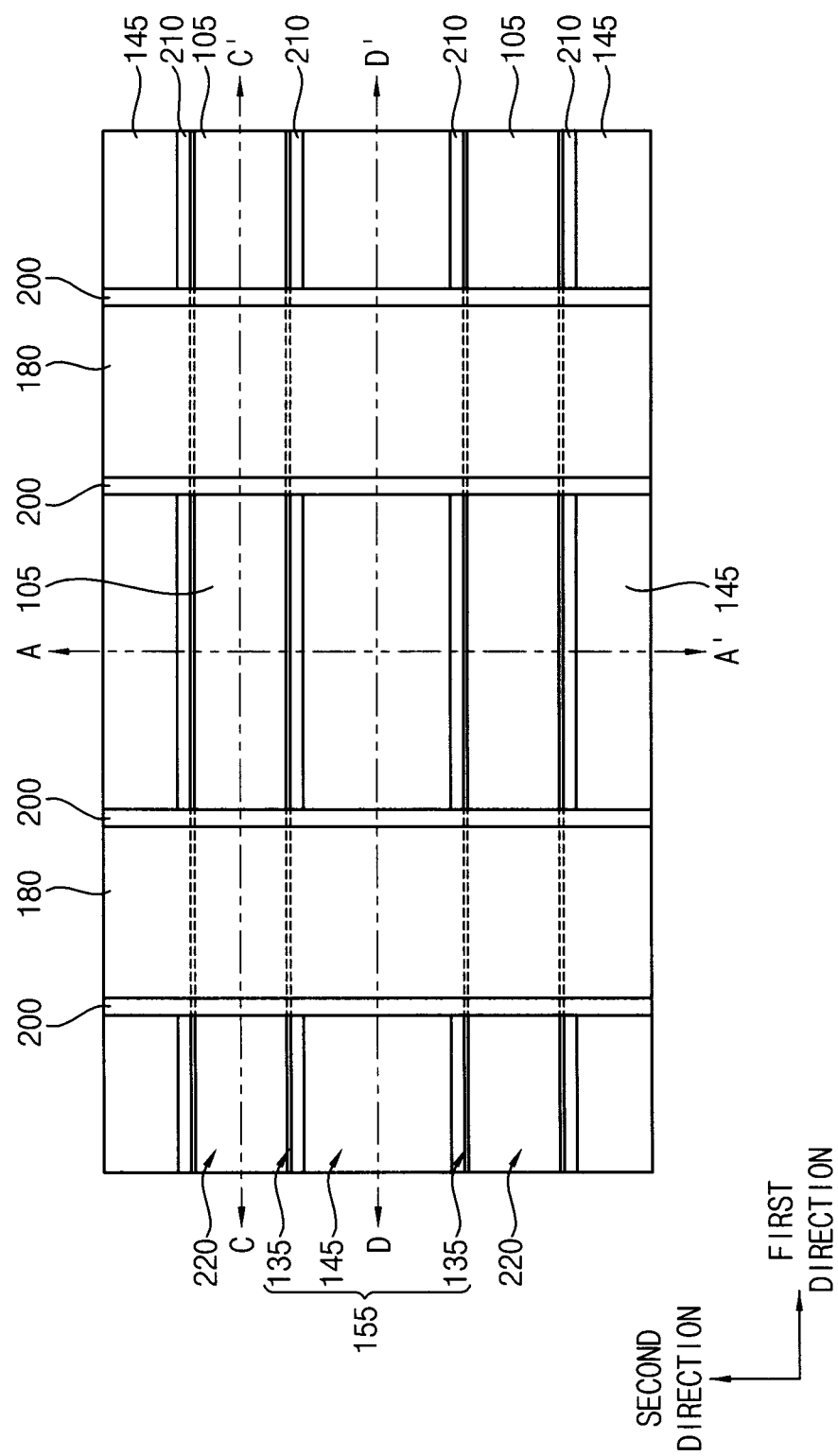
Figure 10:
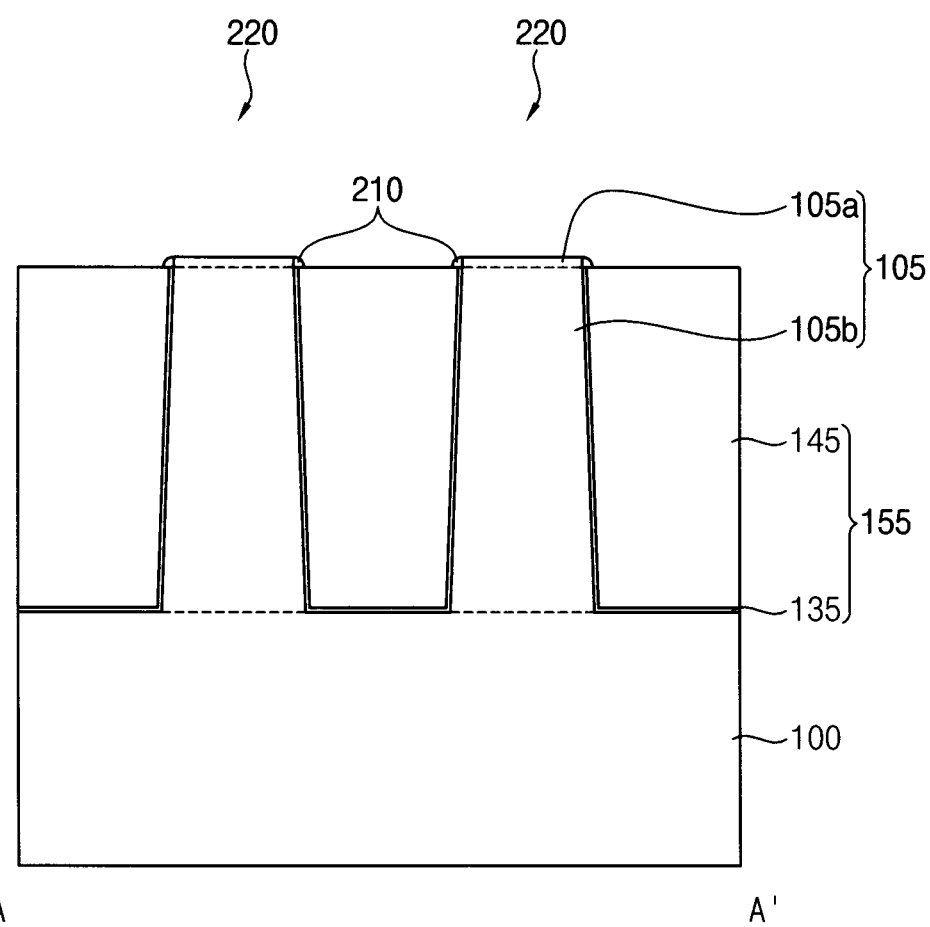
Figure 11:
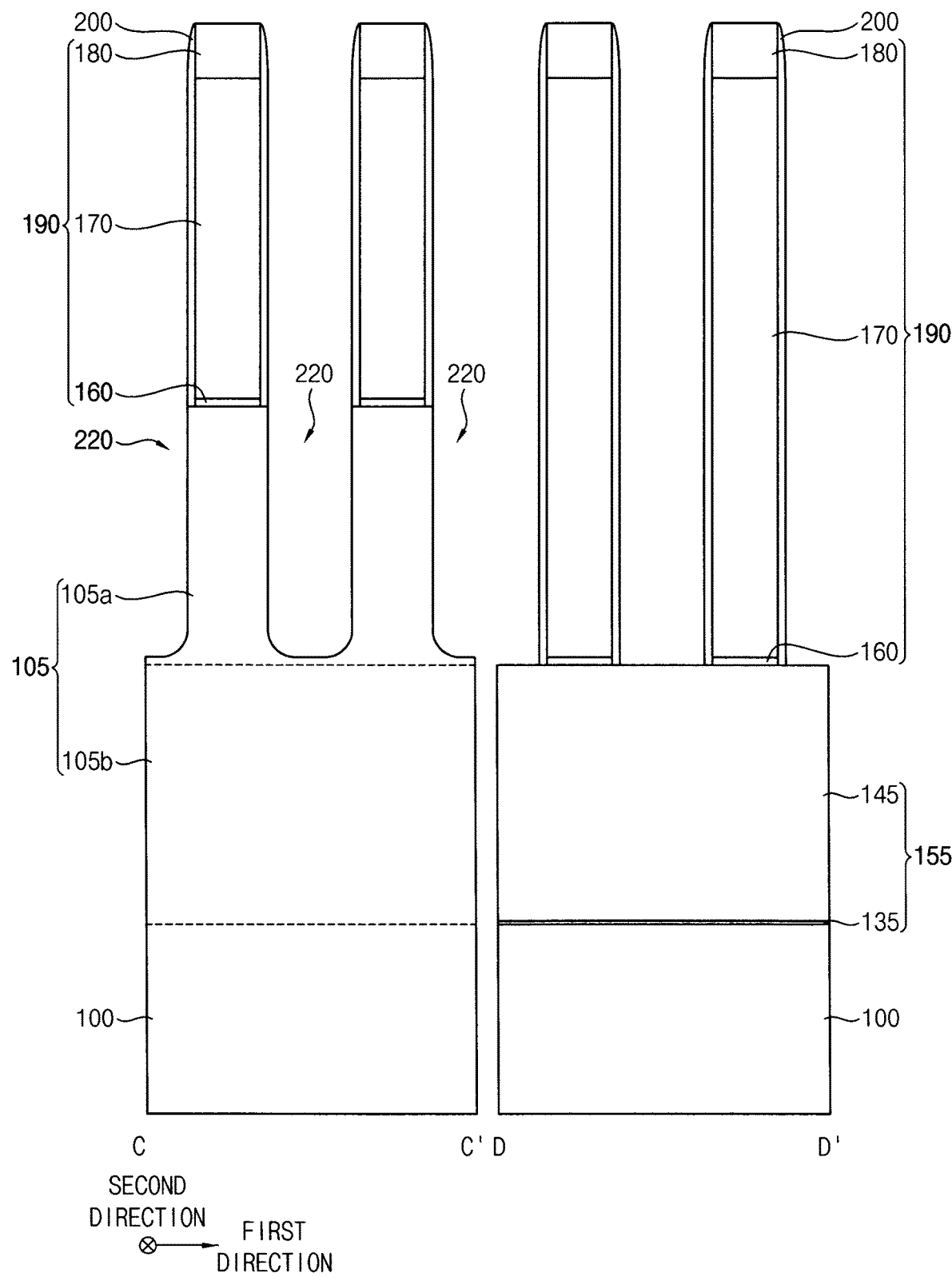

Referring to FIGS. 9 to 11, a spacer layer covering the dummy gate structure 190 may be formed on the first active fin 105 and the first isolation structure 155, and the spacer layer may be anisotropically etched to form a gate spacer 200 on each of opposite sidewalls of the dummy gate structure 190 in the first direction. In this case, a fin spacer 210 may be formed on each of opposite sidewalls of the first upper active pattern 105a in the second direction.

The spacer layer may include a nitride, e.g., silicon nitride. In one embodiment, the spacer layer may have a stacked structure including a nitride layer and an oxide layer.

An upper portion of the first active fin 105 adjacent to the gate spacer 200 may be etched to form a second recess 220.

FIGS. 10 and 11 illustrate that only a portion of the first upper active pattern 105a of the first active fin 105 is etched to form the second recess 220 so that a lower surface of the second recess 220 is higher than an upper surface of the first lower active pattern 105b, however, the embodiments may not be limited thereto. For example, not only the first upper active pattern 105a, but also a portion of the first lower active pattern 105b may also be etched to form the second recess 220, and thus the lower surface of the second recess 220 may be lower than a height of an upper surface of a portion of the first lower active pattern 105b on which no second recess 220 is formed.

When the second recess 220 is formed, the fin spacer 210 on each of the opposite sidewalls of the first upper active pattern 105a may be also partially removed so that a portion of the fin spacer 210 may remain, or the fin spacer 210 may be completely removed.

In example embodiments, the etching process for forming the second recess 220 and the etching process for forming the gate spacer 200 and the fin spacer 210 may be performed in-situ.

Figure 12:
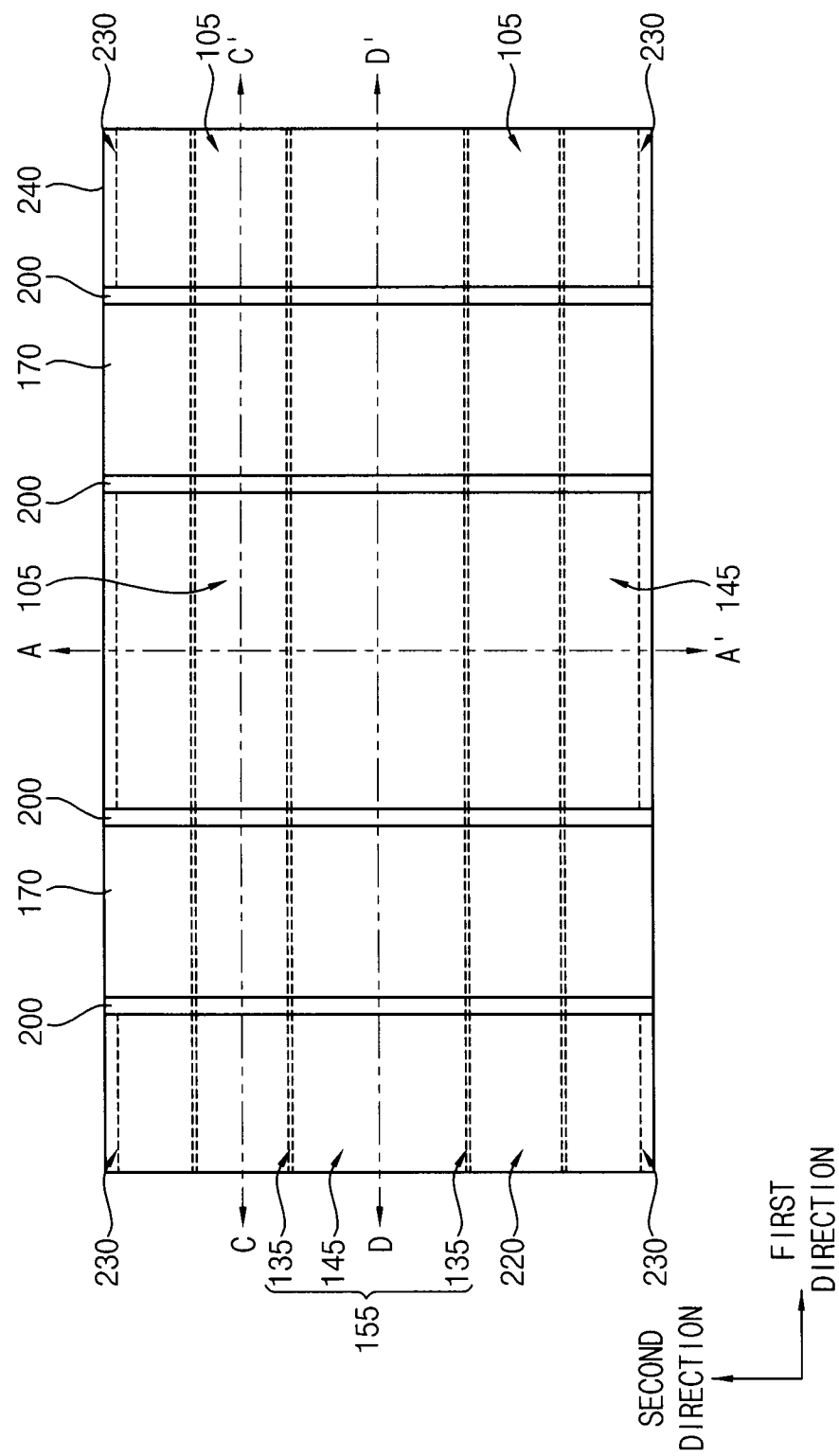
Figure 13:
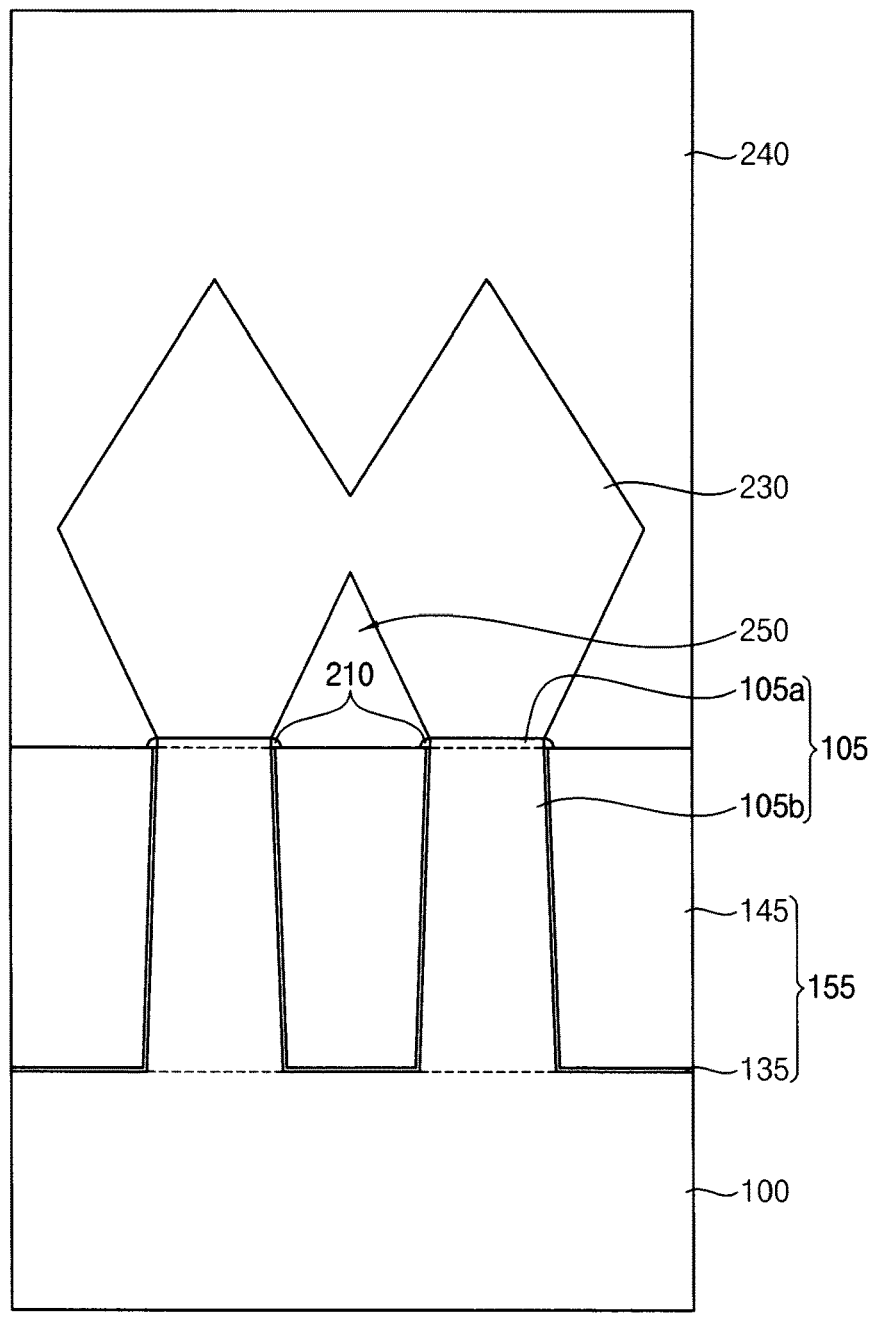
Figure 14:
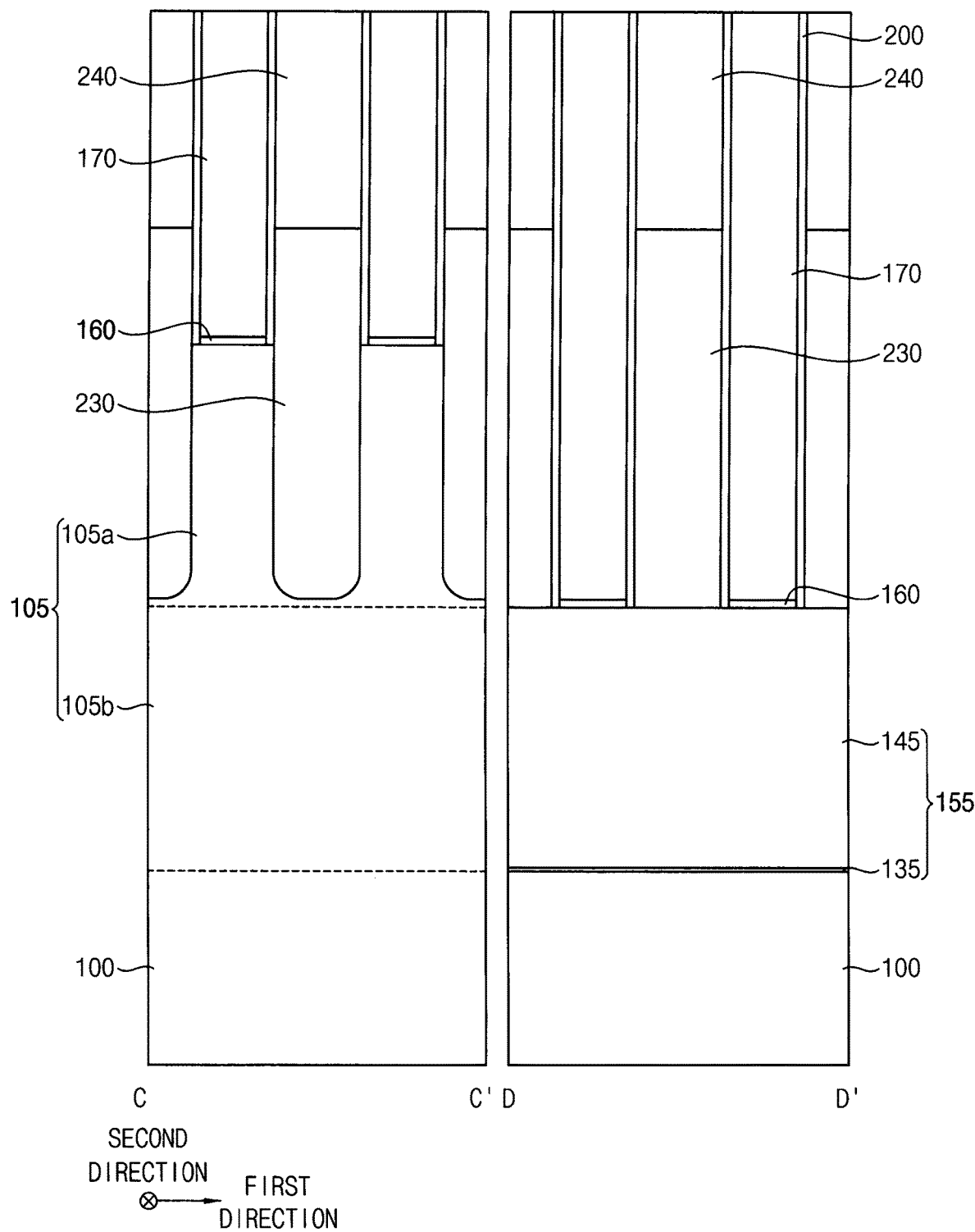

Referring to FIGS. 12 to 14, a first source/drain layer 230 filling the second recess 220 may be formed.

In example embodiments, the first source/drain layer 230 may be formed by performing a selective epitaxial growth (SEG) process using the upper surface of the first active fin 105 exposed by the second recess 220 as a seed.

In example embodiments, the SEG process may be performed using a silicon source gas, a germanium source gas, an etching gas, and a carrier gas, and thus a single crystalline silicon-germanium layer as the first source/drain layer 230 may be formed. The SEG process may also be performed using a P-type impurity source gas, and thus a single crystalline silicon-germanium layer doped with P-type impurities as the first source/drain layer 230 may be formed.

Alternatively, the SEG process may be performed using a silicon source gas, a carbon source gas, an etching gas, and a carrier gas, and thus a single crystalline silicon-carbide layer as the first source/drain layer 230 may be formed. The SEG process may be also performed using an N-type impurity source gas, and thus a single crystalline silicon-carbide layer doped with N-type impurities as the first source/drain layer 230 may be formed. In some embodiments, the SEG process may be performed using a silicon source gas, an etching gas, and a carrier gas, and thus a single crystalline silicon layer as the first source/drain layer 230 may be formed. The SEG process may be also performed using an N-type impurity source gas, and thus a single crystalline silicon layer doped with N-type impurities as the first source/drain layer 230 may be formed.

The first source/drain layer 230 may be grown not only in a vertical direction (e.g., third direction), but also in a horizontal direction (e.g., first and/or second directions) to fill the second recess 220, and an upper portion of the first source/drain layer 230 may contact a sidewall of the gate spacer 200. In example embodiments, the first source/drain layer 230 may have a shape of which a cross-section taken along the second direction may be similar to a pentagon. The term "contact," as used herein, refers to a connection contact (i.e., touching) unless the context indicates otherwise.

In example embodiments, when neighboring ones of the first active fins 105 disposed in the second direction are close to each other, the first source/drain layers 230 growing on the neighboring ones of the first active fins 105, respectively, may be merged with each other at a location between the neighboring first active fins 105. FIG. 13 shows that two first source/drain layers 230 grown on neighboring two first active fins 105, respectively, are merged with each other, however, the embodiments may not be limited thereto. Thus, for example, more than two first source/drain layers 230 may be merged with each other.

After forming an insulating interlayer 240 covering the dummy gate structure 190, the gate spacer 200, the fin spacer 210 and the first source/drain layer 230 to a sufficient height on the first active fin 105 and the first isolation structure 155, the insulating interlayer 240 may be planarized until an upper surface of the dummy gate electrode 170 may be exposed. After planarization, a top surface of the insulating interlayer 240 may be coplanar with the upper surface of the dummy electrode 170. During the planarization process, the dummy gate mask 180 may be also removed together with the insulating interlayer 240.

A space between the merged first source/drain layers 230 and the first isolation structure 155 may not be completely filled with the insulating interlayer 240, and thus a first opening 250 may be formed therein. The first opening 250 may be formed below the merged portion of the first source/drain layers 230 and above the first isolation structure 155. The first opening 250 may be bounded by the first source/drain layers 230 and the first isolation structure 155.

The insulating interlayer 240 may include a silicon oxide, e.g., tonen silazene (TOSZ). The planarization process may be performed by a CMP process and/or an etch back process.

Figure 15:
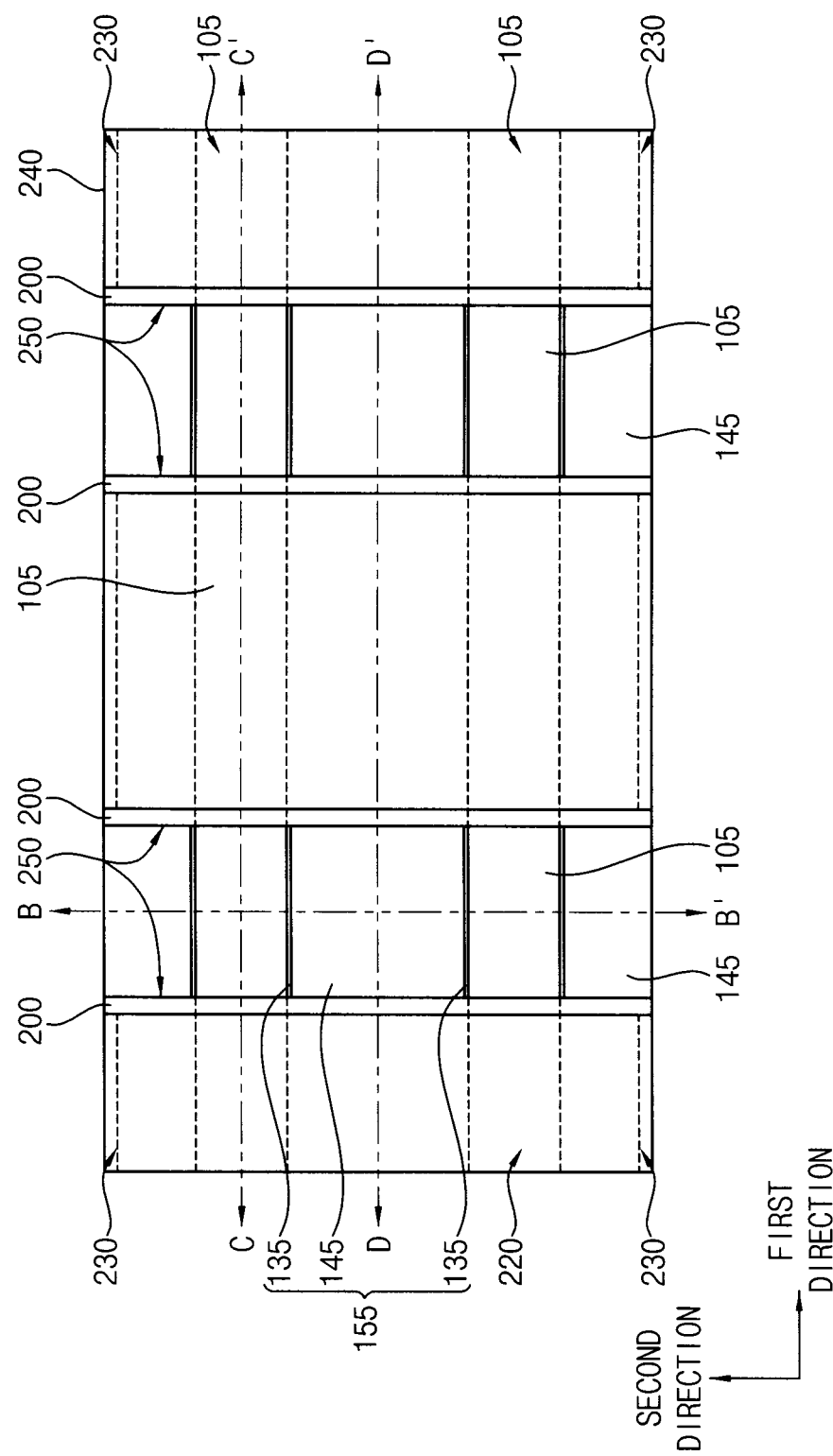
Figure 17:
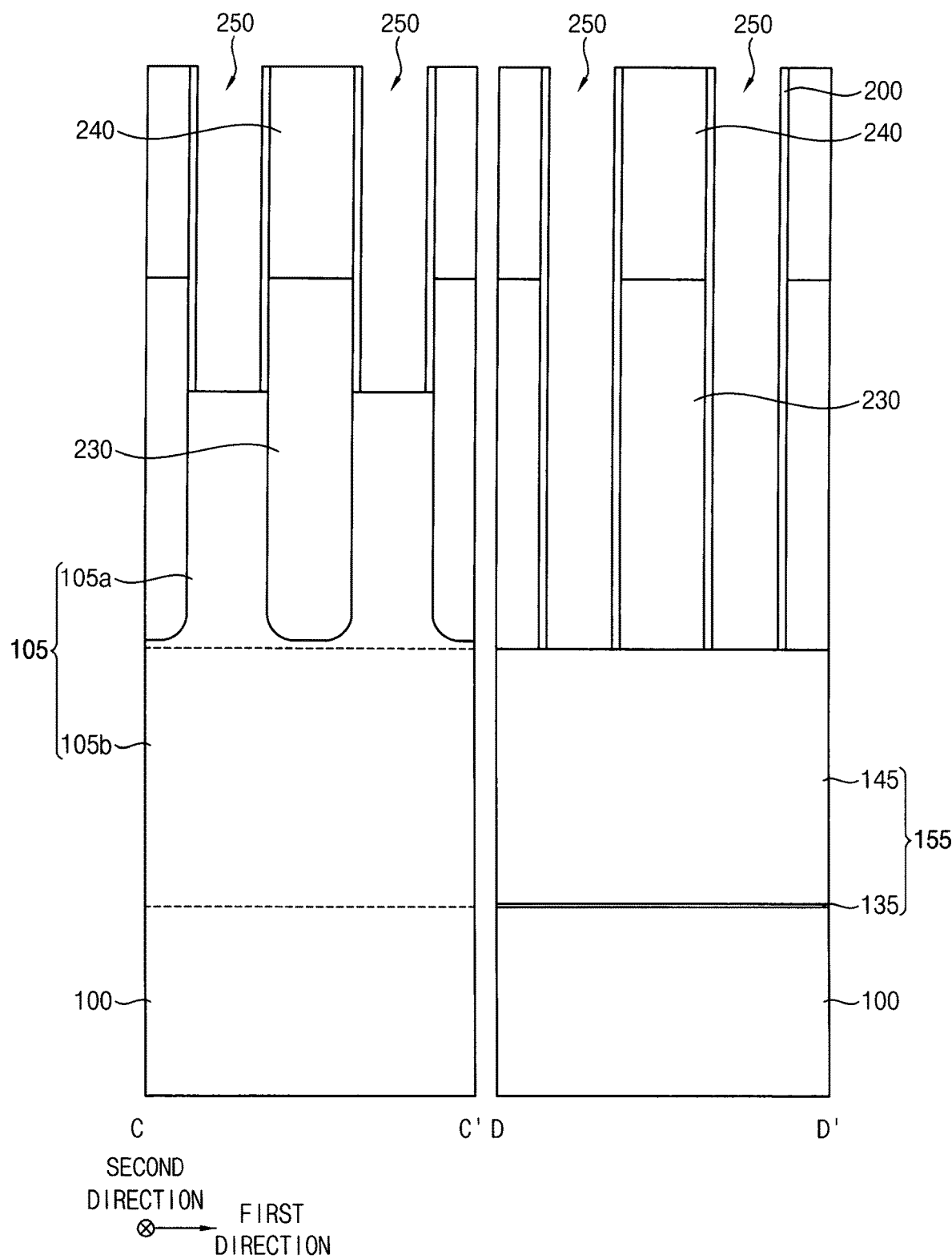
Figure 18:
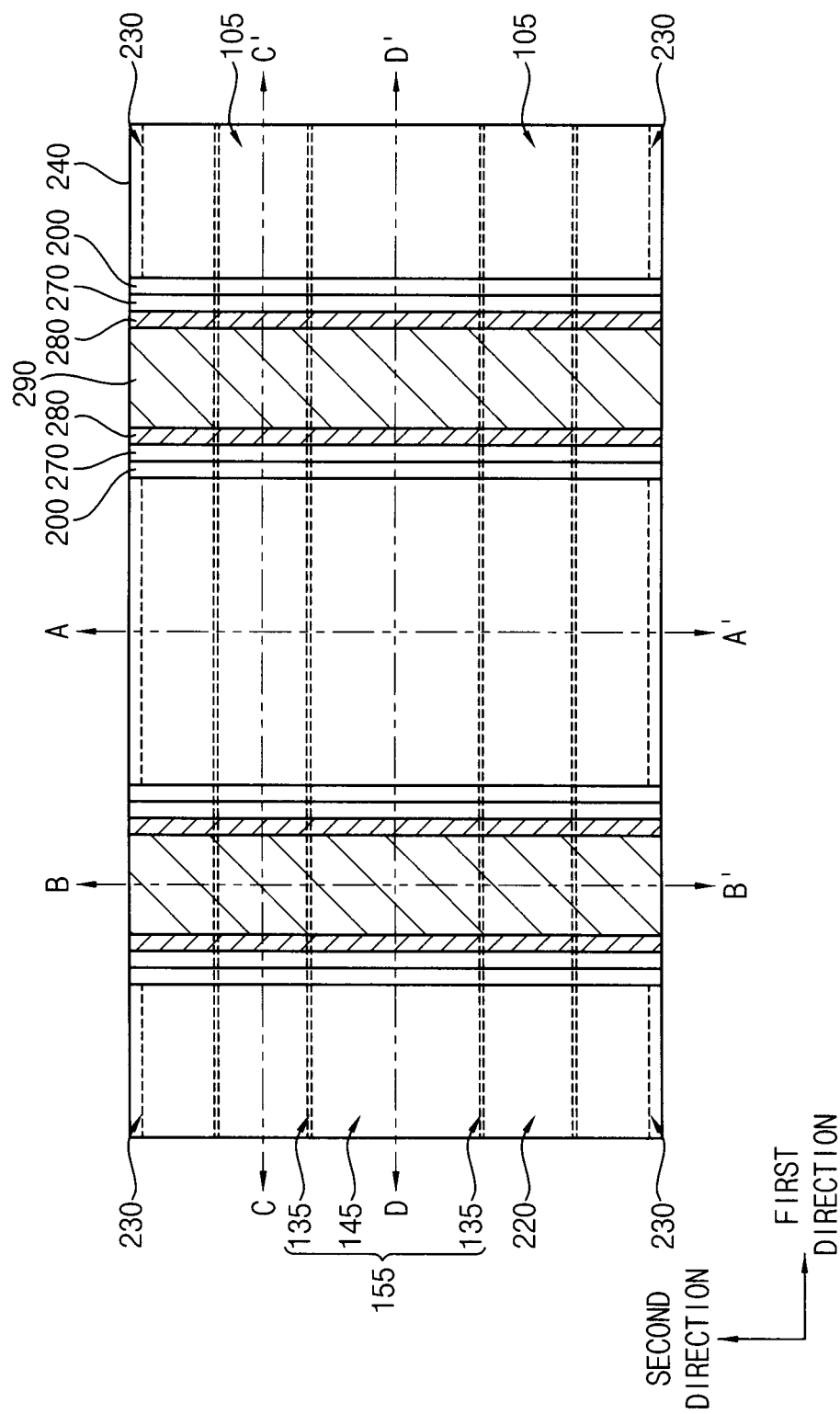
Figure 19:
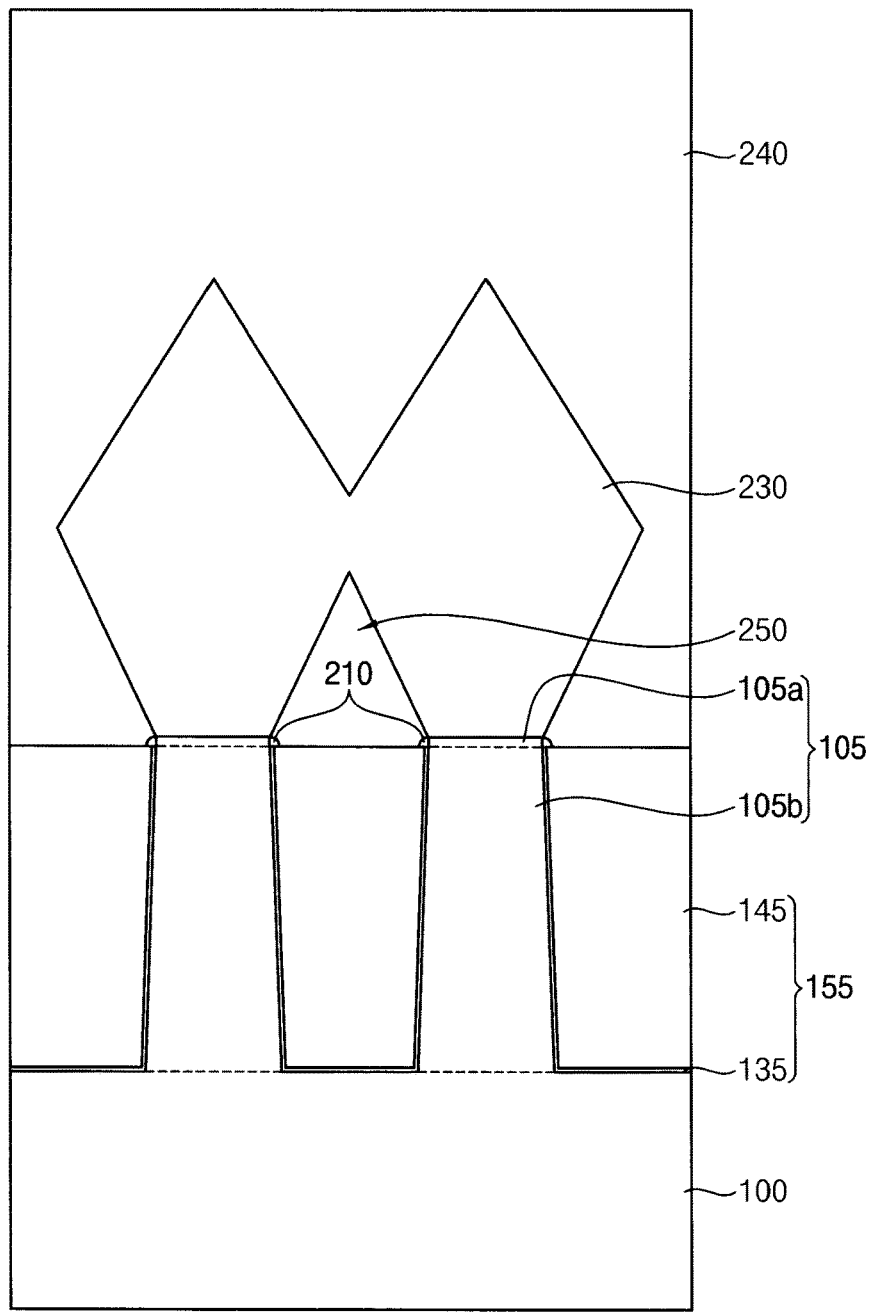

Referring to FIGS. 15 to 17, the exposed dummy gate electrode 170 and the dummy gate insulation pattern 160 thereunder may be removed to form a first opening 250 exposing an inner sidewall of the gate spacer 200 and the upper surface of the first active fin 105.

In example embodiments, the dummy gate electrode 170 and the dummy gate insulation pattern 160 thereunder may be removed by a dry etching process and a wet etching process.

The wet etching process may be performed using a hydrofluoric acid (HF), and an upper portion of the first liner 135 included in the first isolation structure 155 under the dummy gate insulation pattern 160 may be partially removed. For example, a relatively small portion of the first liner 135 may be removed from between the blocking pattern 145 and the first lower active pattern 105b, near the upper surface of the blocking pattern 145. However, since the first liner 135 may have a relatively very small thickness, most of a portion of the first isolation structure 155 contacting a lower surface of the dummy gate insulation pattern 160 may be occupied by the blocking pattern 145.

In the wet etching process using a hydrofluoric acid (HF), the blocking pattern 145 may include a material having a high etching selectivity with respect to an oxide included in the dummy gate insulation pattern 160, and thus may be hardly etched. As a result, the first opening 250 may substantially expose only the first upper active pattern 105a of the first active fin 105 and the blocking pattern 145 adjacent thereto in the second direction, and the first source/drain layer 230 may not be exposed.

However, as described above, the upper portion of the first liner 135 may be partially removed, and thus an uppermost surface of a portion of the first liner 135 under the dummy gate insulation pattern 160 may be lower than an uppermost surface of a portion of the first liner 135 spaced apart therefrom in the first direction. Additionally, the uppermost surface of a portion of the first liner 135 under the dummy gate insulation pattern 160 may be lower than an upper surface of the blocking pattern 145.

Referring to FIGS. 18 to 21, a first gate electrode structure 300 filling the first opening 250 may be formed.

Specifically, after performing a thermal oxidation process on the upper surface of the first active fin 105 exposed by the first opening 250 to form a first interface pattern 260, a gate insulation layer, and a work function control layer may be sequentially formed on the first interface pattern 260, the first isolation structure 155, the gate spacer 200 and the insulating interlayer 240, and a gate electrode layer filling a remaining portion of the first opening may be formed on the work function control layer.

The work function control layer and the gate electrode layer may be formed by, e.g., a CVD process, an ALD process, a physical vapor deposition (PVD) process, etc. A heat treatment process, e.g., a rapid thermal annealing (RTA) process, a spike-RTA process, a flash-RTA process or a laser annealing process, etc., may be further performed on the gate electrode layer.

Similarly to the gate insulation layer or the gate electrode layer, the first interface pattern 260 may be formed by a CVD process or an ALD process instead of a thermal oxidation process, and in this case, the first interface pattern 260 may be formed on not only the upper surface of the first active fin 105, but also an upper surface of the first isolation structure 155 and the inner sidewall of the gate spacer 200. In some embodiments, the first interface pattern 260 may be formed in the space between the blocking pattern 145 and the first lower active pattern 105b, near the upper surface of the blocking pattern 145, where the portion of the first liner 135 was removed by the wet etching process performed using a hydrofluoric acid (HF). Alternatively, the first interface pattern 260 may not be formed.

The gate electrode layer, the work function layer, and the gate insulation layer may be planarized until an upper surface of the insulating interlayer 240 is exposed to form a first gate insulation pattern 270 and a first work function control pattern 280 sequentially stacked on an upper surface of the first interface pattern 260, the upper surface of the first isolation structure 155, and the inner sidewall of the gate spacer 200, and a first gate electrode 290 filling a remaining portion of the first opening 250 may be formed on the first work function control pattern 280.

The first interface pattern 260, the first gate insulation pattern 270, the first work function control pattern 280, and the first gate electrode 290, sequentially stacked, may form the first gate electrode structure 300, and may form a transistor together with the first source/drain layer 230. The transistor may form a PMOS transistor or an NMOS transistor according to the conductivity type of the first source/drain layers 230.

As described above, since the first opening 250 may not expose the first source/drain layer 230, the first gate electrode structure 300 and the first source/drain layer 230 filling the first opening 250 may not contact each other, and an electrical short may not occur therebetween.

Figure 22:
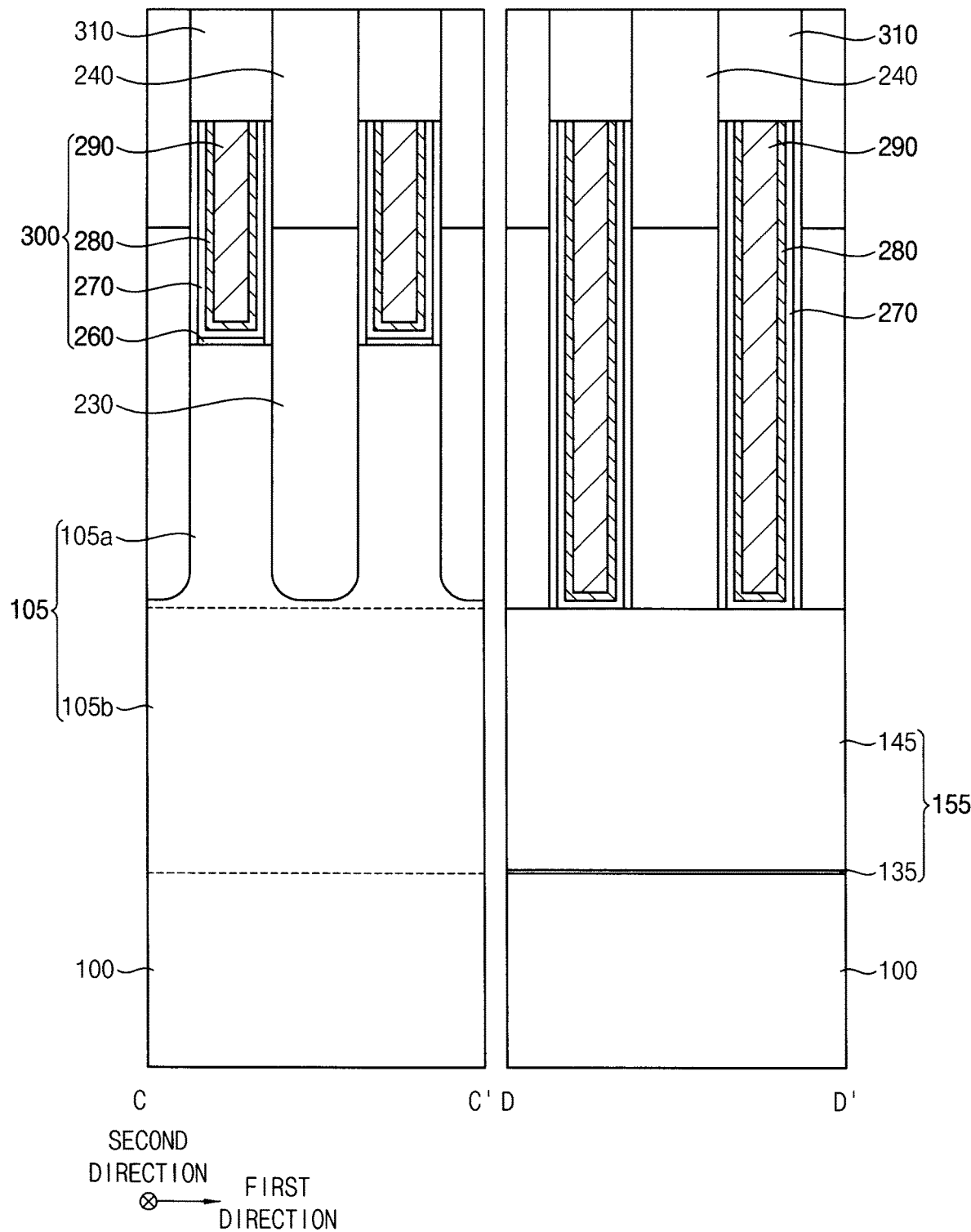

Referring to FIG. 22, after removing upper portions of the first gate electrode structure 300 and the gate spacer 200 to form a third recess, a capping pattern 310 filling the third recess may be formed.

The capping pattern 310 may be formed by forming a capping layer filling the third recess on the first gate electrode structure 300, the gate spacer 200, and the insulating interlayer 240, and by planarizing the capping layer until the upper surface of the insulating interlayer 240 is exposed.

In example embodiments, the capping pattern 310 may include a nitride, e.g., silicon nitride.

The first gate electrode structure 300, the gate spacer 200 covering a sidewall of the first gate electrode structure 300, and the capping pattern 310 covering upper surfaces of the first gate electrode structure 300 and the gate spacer 200 may be altogether referred to as a first gate structure.

A contact plug, a via, and a wiring electrically connected to the first source/drain layer 230 and/or the first gate electrode structure 300 may be formed to complete the fabrication of the semiconductor device.

The semiconductor device may include the first active fins 105 protruding from the upper surface of the substrate 100 and being spaced apart from each other by the first recess 120 therebetween, the first isolation structure 155 including the first liner 135 on a lower sidewall and a lower surface of the first recess 120 and the blocking pattern 145 on the first liner 135 filling the remaining portion of the lower portion of the first recess 120, the first gate electrode structure 300 on the first active fins 105 and the first isolation structure 155, and the first source/drain layer 230 on a portion of each of the first active fins 105 adjacent to the first gate electrode structure 300.

The semiconductor device may further include the gate spacer 200 covering the sidewall of the first gate electrode structure 300, and the first gate electrode structure 300 and the first source/drain layer 230 may be electrically insulated from each other by the gate spacer 200 and the first isolation structure 155 including the blocking pattern 145.

Figure 23:
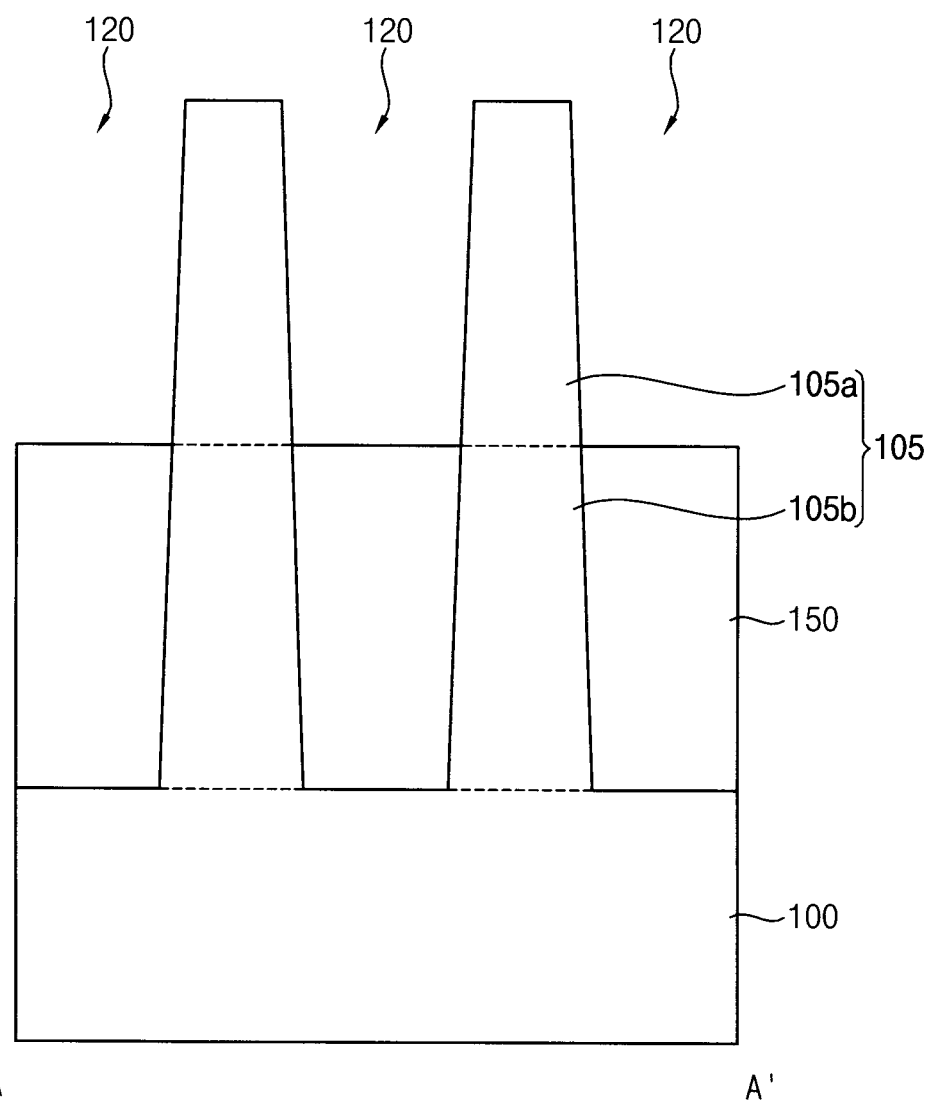
FIGS. 23 to 29 are plan views and cross-sectional views illustrating stages of a method of manufacturing a semiconductor device in accordance with example embodiments.
Figure 24:
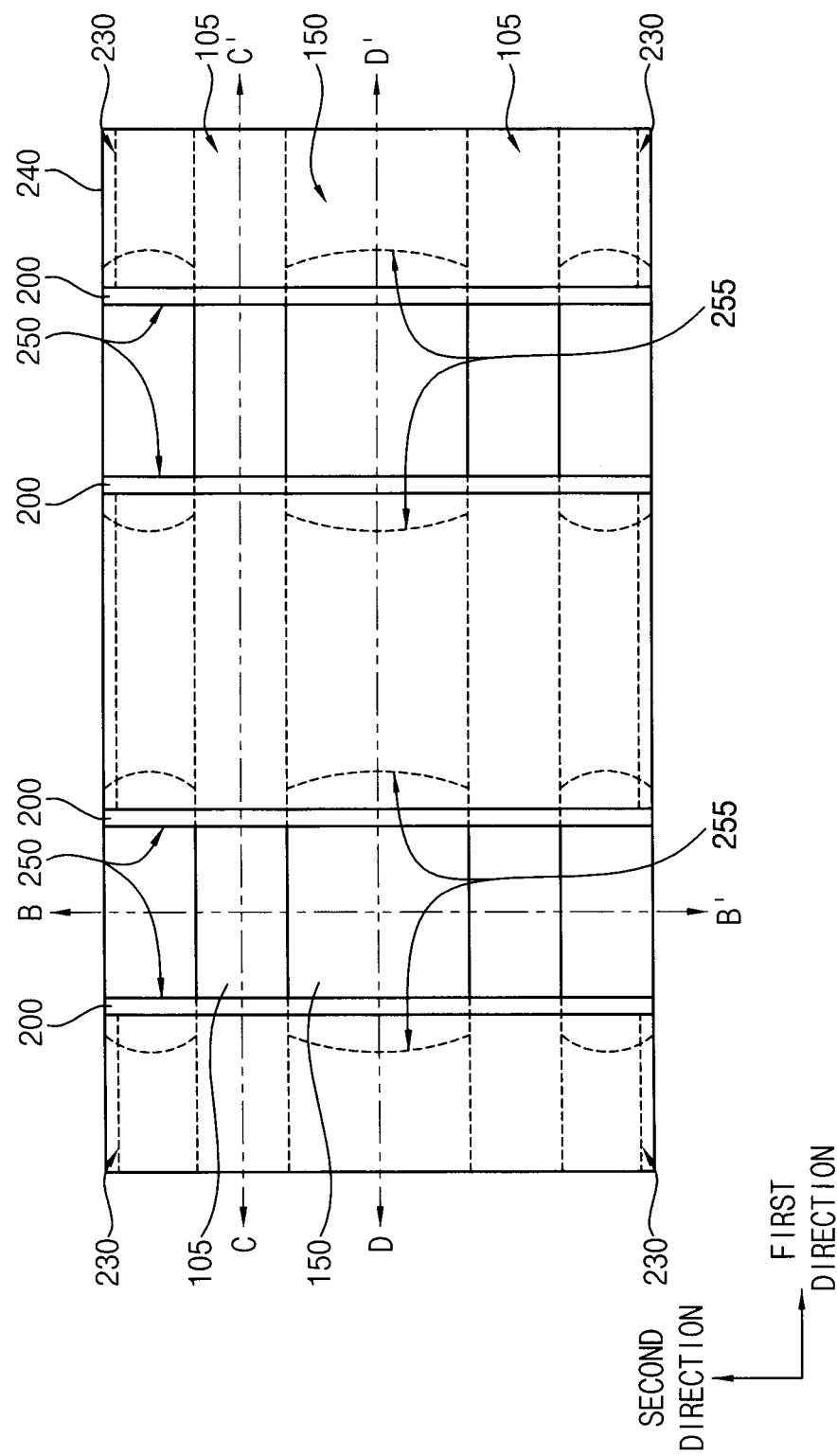
Figure 25:
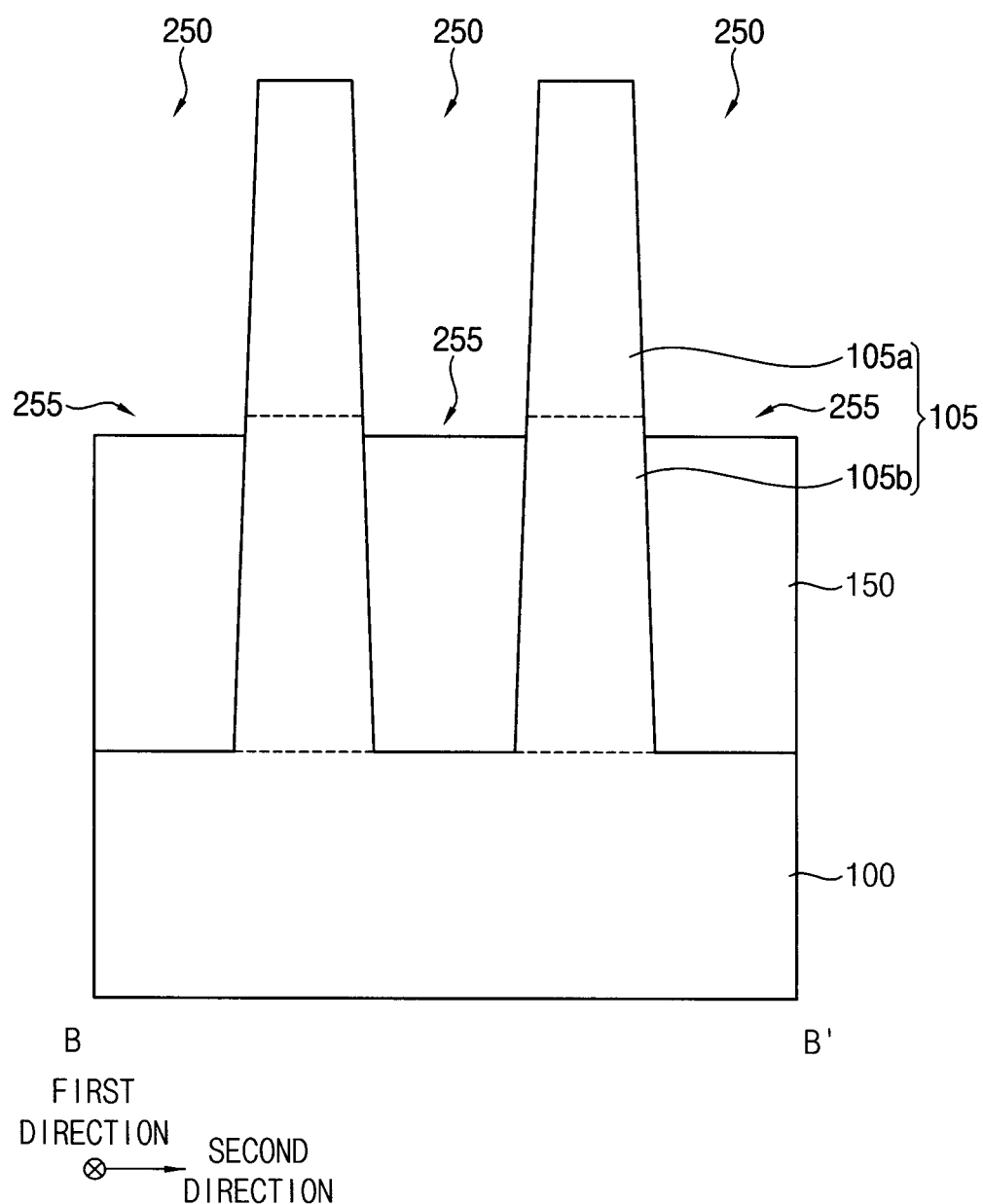
Figure 26:
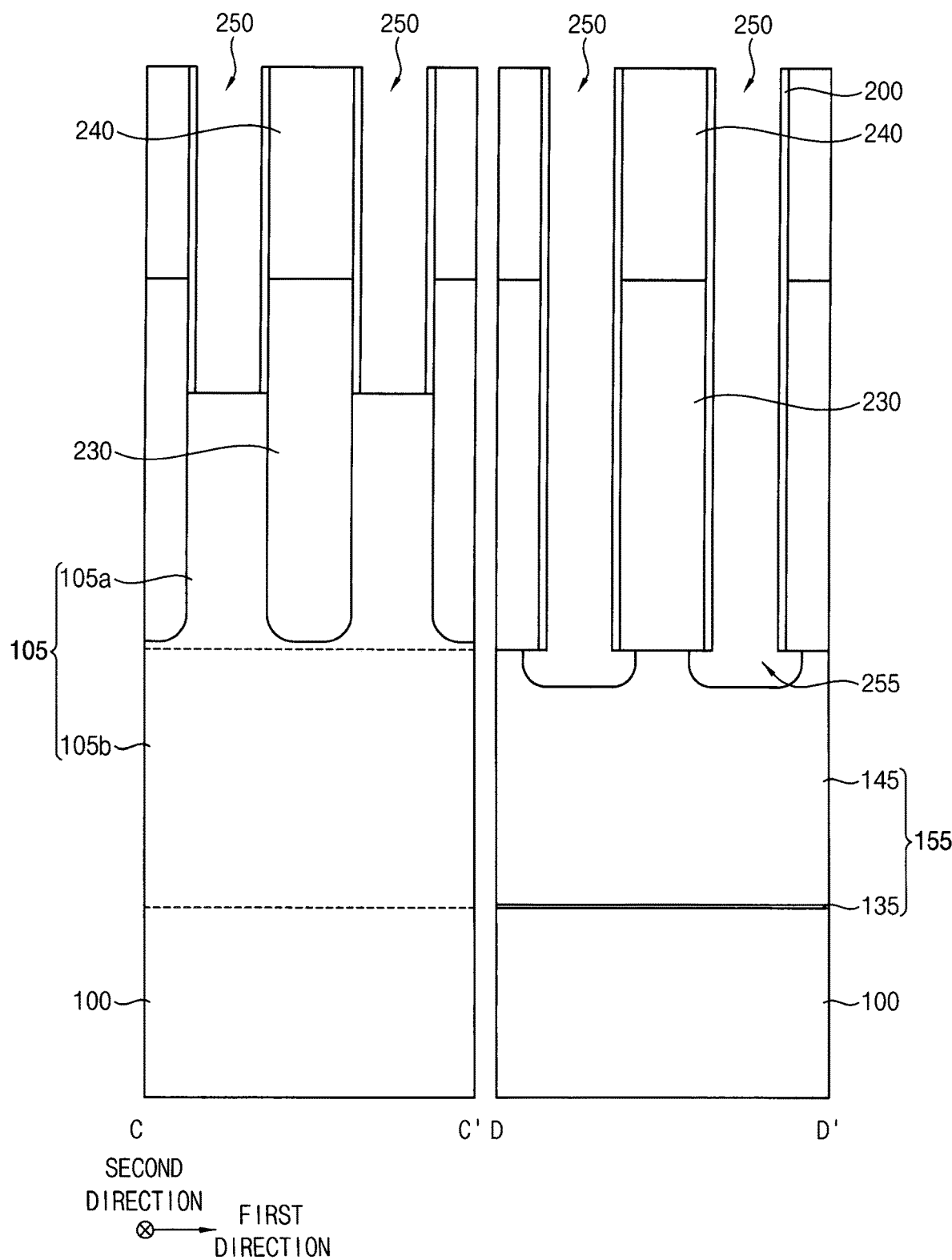
Figure 27:
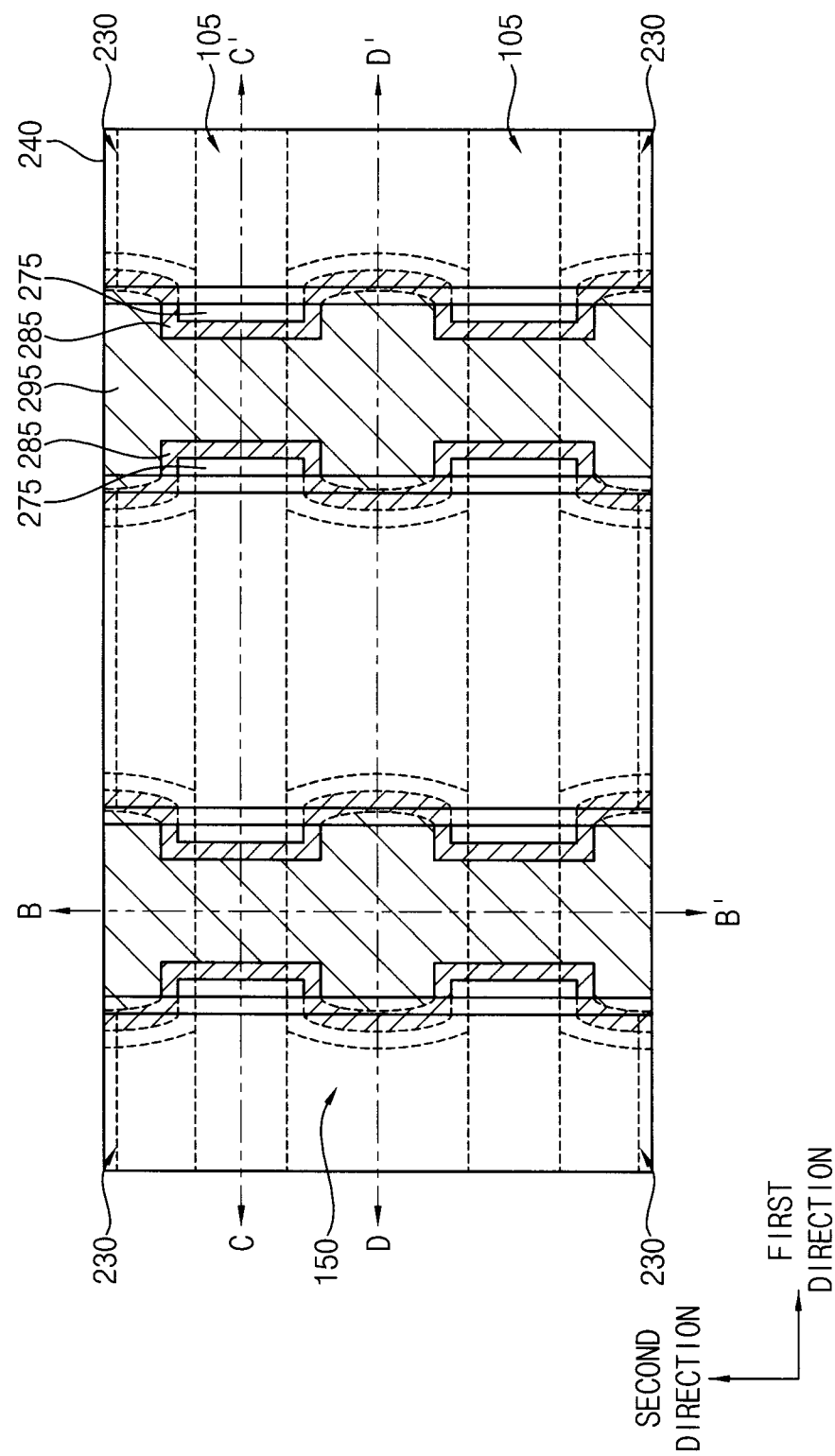

FIGS. 23 to 29 are plan views and cross-sectional views illustrating stages of a method of manufacturing a semiconductor device in accordance with a comparative example embodiment. Specifically, FIGS. 24 and 27 are plan views, and FIGS. 23, 25 to 26, and 28 to 29 are cross-sectional views.

Figure 28:
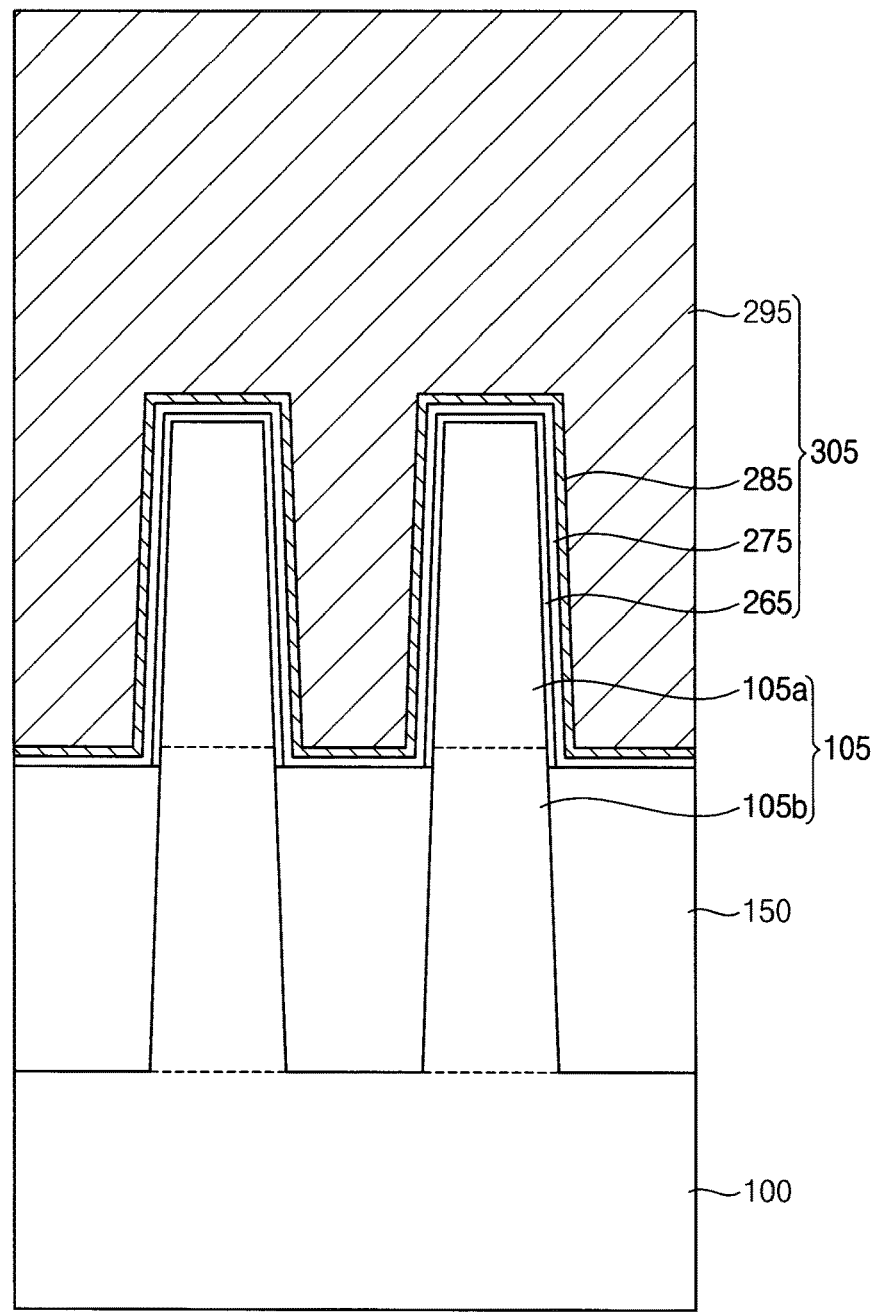
Figure 29:
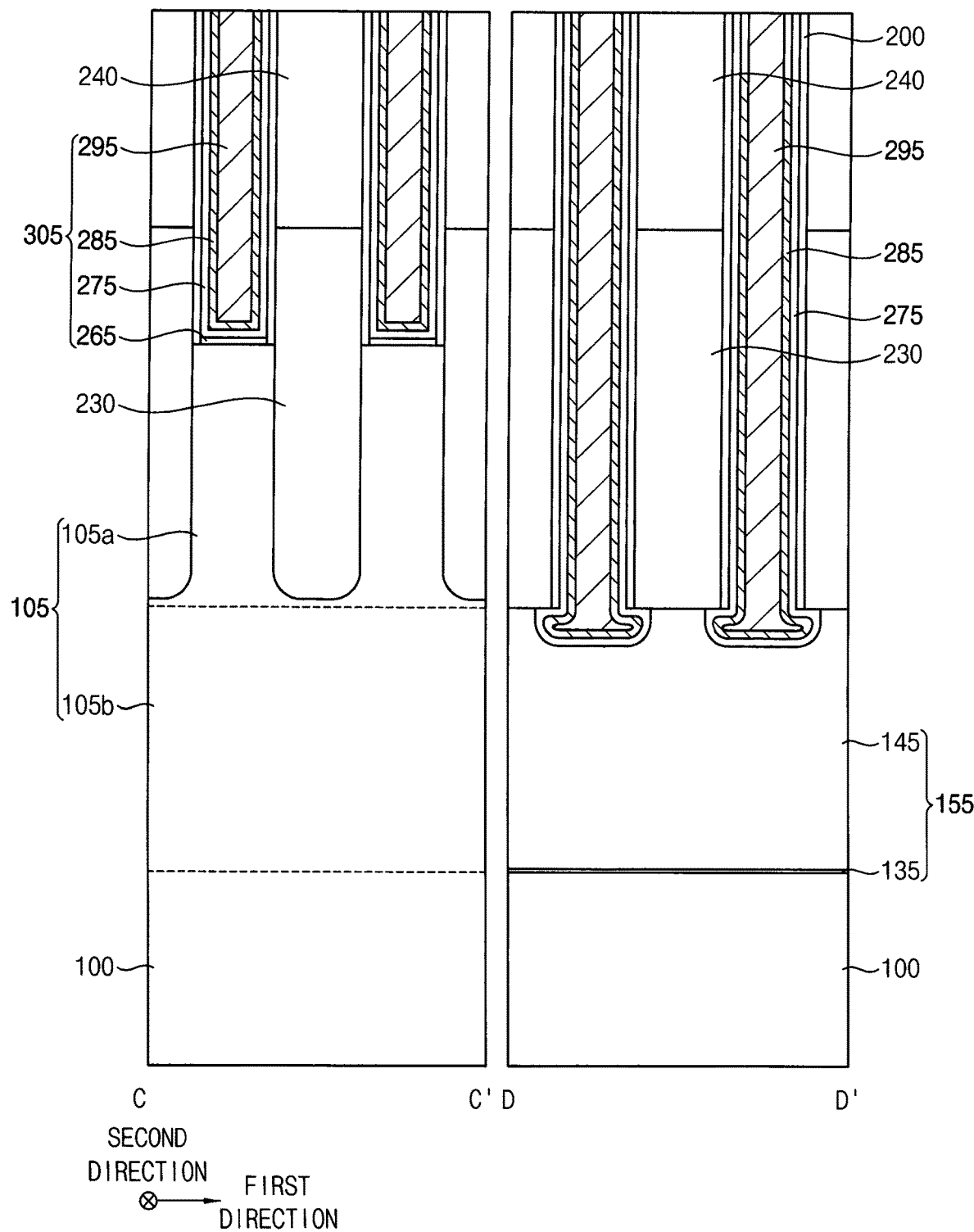

FIG. 23 is a cross-sectional view taken along a line A-A' of a corresponding plan view, FIGS. 25 and 28 are cross-sectional views taken along lines B-B' of corresponding plan views, respectively, and FIGS. 26 and 29 include cross-sectional views taken along lines C-C' and lines D-D' of corresponding plan views, respectively.

This exemplary method of manufacturing the semiconductor device includes processes substantially the same as or similar to the processes included in the method illustrated in FIGS. 1 to 22, and thus detailed descriptions thereon are omitted herein.

Referring to FIG. 23, after performing processes substantially the same as or similar to the processes illustrated in FIGS. 1 and 2, an isolation pattern 150 filling the lower portion of the first recess 120 may be formed.

The isolation pattern 150 may be formed by forming an isolation layer on the first active fin 105, the first mask 110, and the substrate 100, planarizing the isolation layer until the upper surface of the first active fin 105 is exposed, and removing an upper portion of the isolation layer.

The isolation pattern 150 may include an oxide, e.g., silicon oxide.

Referring to FIGS. 24 to 26, processes substantially the same as or similar to the processes illustrated in FIGS. 6 to 17 may be performed.

However, when the dummy gate insulation pattern 160 is removed by the wet etching process using a hydrofluoric acid (HF), a portion of the isolation pattern 150 contacting a lower surface of the dummy gate insulation pattern 160 and portions of the isolation pattern 150 adjacent thereto in the first direction may be removed altogether. Accordingly, a fourth recess 255 connected to a lower portion of the first opening 250 and extending lengthwise in the first direction by a given length may be formed on the isolation pattern 150. The fourth recess 255 may extend below an upper surface of the blocking pattern 145, and be formed in an upper portion of the first isolation structure 155. Portions of the fourth recess 255 may be formed below the gate spacers 200 and portions of the first source/drain layer 230. As a result, a portion of the lower surface of the first source/drain layer 230 adjacent to the gate spacer 200 may be exposed by the fourth recess 255.

Referring to FIGS. 27 to 29, processes substantially the same as or similar to the processes illustrated in FIGS. 18 to 21 may be performed.

Accordingly, a second gate electrode structure 305 including a second interface pattern 265, a second gate insulation pattern 275, a second work function control pattern 285, and a second gate electrode 295 sequentially stacked may be formed to fill the first opening 250 and the fourth recess 255. The second gate electrode structure 305 may contact a portion of the lower surface of the first source/drain layer 230 through the fourth recess 255, so that an electrical short may occur between the second gate electrode structure 305 and the first source/drain layer 230.

In the method of manufacturing the semiconductor device in accordance with example embodiments illustrated in FIGS. 1 to 22, the first opening 250 formed by the wet etching process using a hydrofluoric acid (HF) may not expose the first source/drain layer 230, and thus an electrical short may not occur between the first gate electrode structure 300 and the first source/drain layer 230.

FIGS. 30 to 35 are cross-sectional views illustrating stages of a method of manufacturing a semiconductor device in accordance with example embodiments.

This method of manufacturing the semiconductor device includes processes substantially the same as or similar to the processes included in the method illustrated in FIGS. 1 to 22, and thus detailed descriptions thereon are omitted herein.

Figure 30:
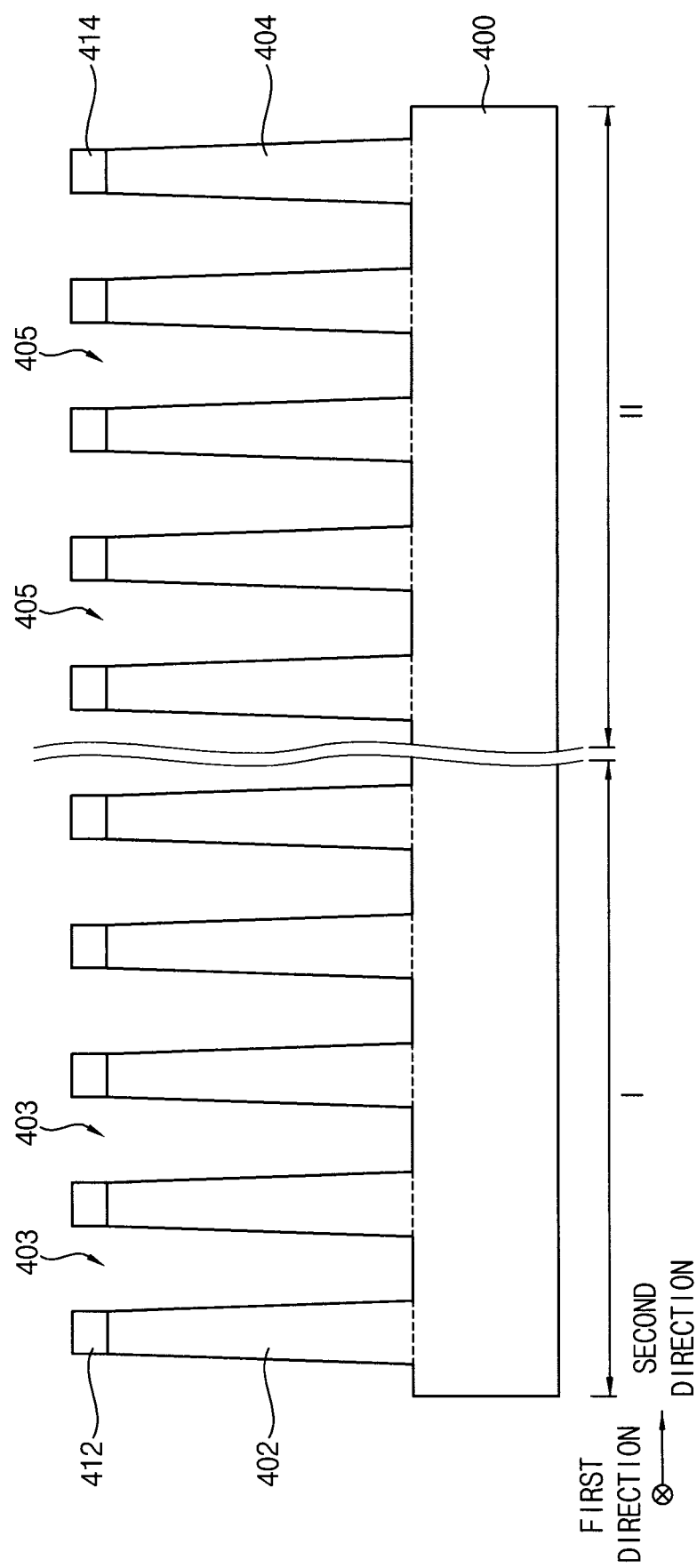
FIGS. 30 to 35 are cross-sectional views illustrating stages of a method of manufacturing a semiconductor device in accordance with example embodiments.

Referring to FIG. 30, an upper portion of a substrate 400 may be partially etched to form second and third active fins 402 and 404.

The substrate 400 may include first and second regions I and II. In example embodiments, the first region I may be an NMOS region, and the second region II may be a PMOS region.

In example embodiments, after forming second and third masks 412 and 414 on the first and second regions I and II, respectively, of the substrate 400, the upper portion of the substrate 400 may be etched using the second and third masks 412 and 414 as an etching mask to form the second and third active fins 402 and 404 on the first and second regions I and II, respectively. Each of the second and third active fins 402 and 404 may extend lengthwise in a first direction substantially parallel to an upper surface of the substrate 400, and a plurality of second active fins 402 and a plurality of third active fins 404 may be formed on the first and second directions I and II, respectively, in a second direction substantially parallel to the upper surface of the substrate 400 and intersecting with the first direction.

The second active fins 402 may be spaced apart from each other by a fifth recess 403 in the second direction, and the third active fins 404 may be spaced apart from each other by a sixth recess 405 in the second direction.

Figure 31:
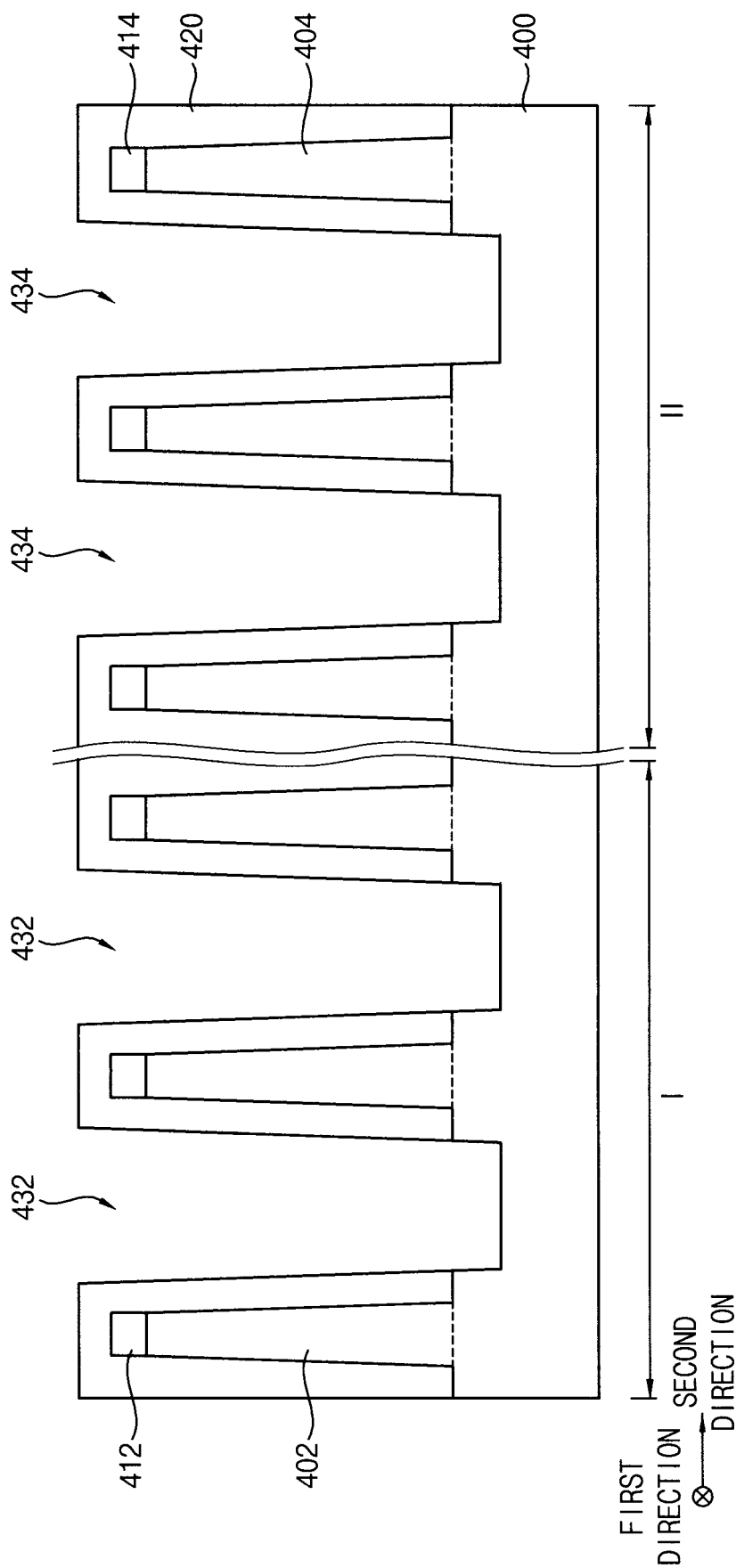

Referring to FIG. 31, after forming a first insulation layer 420 covering the second and third active fins 402 and 404 and the second and third masks 412 and 414 on the substrate 400 to fill the fifth and sixth recesses 403 and 405, one or ones of the second active fins 402, the second mask 412 thereon, a portion of the first insulation layer 420 covering the one or ones of the second active fins 402, and an upper portion of the substrate 400 thereunder may be removed to form a second opening 432 on the first region I of the substrate 400, and one or ones of the third active fins 404, the third mask 414 thereon, a portion of the first insulation layer 420 covering the one or ones of the third active fins 404, and an upper portion of the substrate 400 thereunder may be removed to form a third opening 434 on the second region II of the substrate 400.

Accordingly, the second opening 432 may be formed in the fifth recess 403 to have a lower surface lower than that of the fifth recess 403, and may be regarded as a portion of the fifth recess 403. In this case, a lower surface of a central portion of the fifth recess 403 may be lower than a lower surface of an edge portion of the fifth recess 403. For example, the lower surface of the edge portion of the fifth recess 403 may be the portion below the first insulation layer 420 that covers the sidewall of the second active fins 402, and the lower surface of the central portion of the fifth recess 403 may be the portion between adjacent edge portions. Also, the third opening 434 may be formed in the sixth recess 405 to have a lower surface lower than that of the sixth recess 405, and may be regarded as a portion of the sixth recess 405. In this case, a lower surface of a central portion of the sixth recess 405 may be lower than a lower surface of an edge portion of the sixth recess 405. For example, the lower surface of the edge portion of the sixth recess 405 may be the portion below the first insulation layer 420 that covers the sidewall of the third active fins 404, and the lower surface of the central portion of the sixth recess 405 may be the portion between adjacent edge portions.

In example embodiments, the first insulation layer 420 may include an oxide, e.g., silicon oxide.

In example embodiments, each of the second and third openings 432 and 434 may extend lengthwise in the first direction, and thus each of portions of the first insulation layer 420 extending lengthwise in the first direction may contain the second active fin 402 or the third active fin 404 therein.

FIG. 31 illustrates that the first insulation layer 420 covers only one second active fin 402 between the second openings 432 on the first region I of the substrate 400, and covers only one third active fin 404 between the third openings 432 on the second region II of the substrate 400, however, the embodiments may not be limited thereto. For example, the first insulation layer 420 may contain one or a plurality of second active fins 402, or one or a plurality of third active fins 404 therein.

Figure 32:
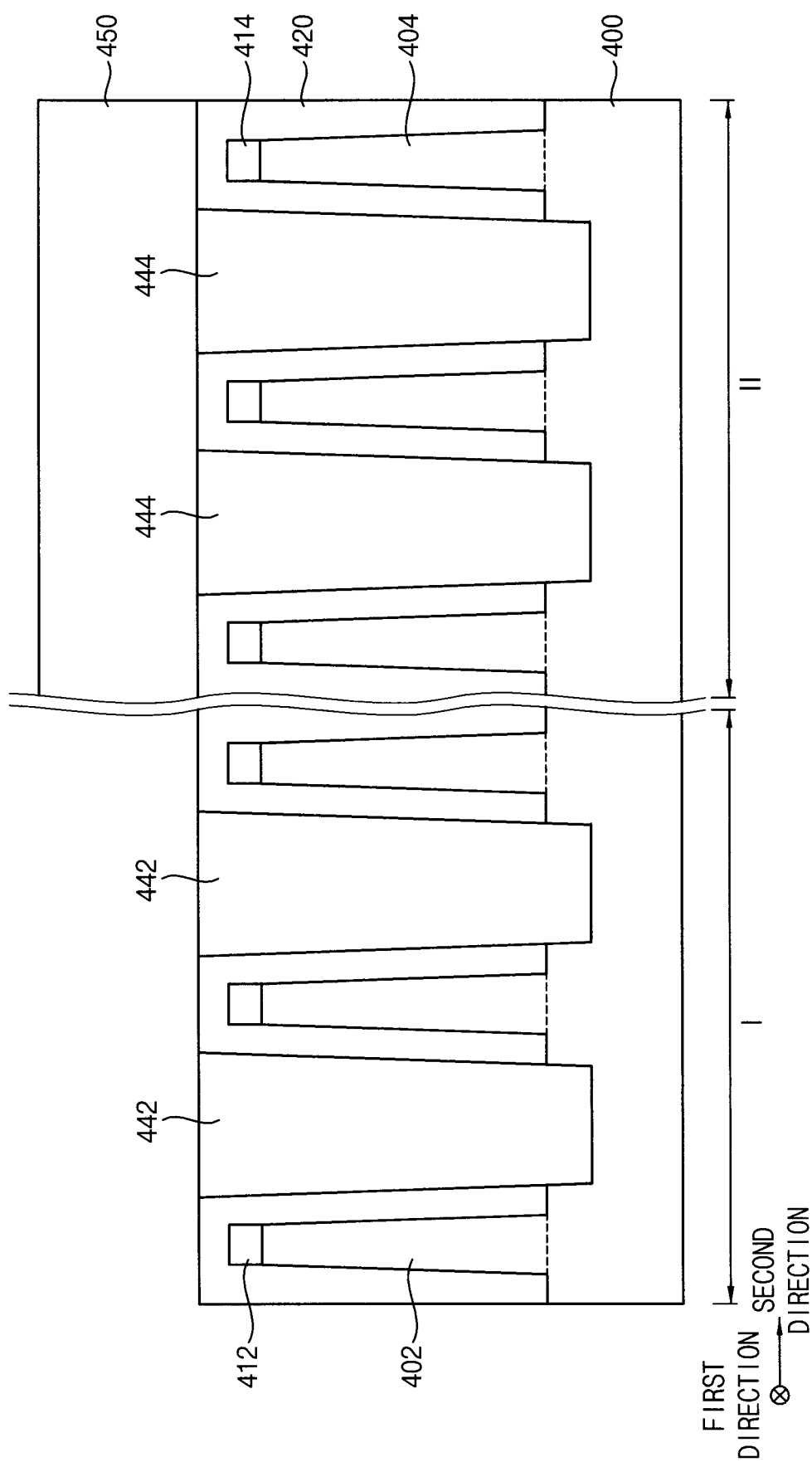

Referring to FIG. 32, after forming second and third insulation patterns 442 and 444 filling the second and third openings 432 and 434, respectively, on the first and second regions I and II of the substrate 400, respectively, a fourth mask 450 may be formed on the first insulation layer 420 and the third insulation pattern 444 on the second region II of the substrate 400.

The second and third insulation patterns 442 and 444 may include substantially the same material, and may include a nitride, e.g., silicon nitride. The fourth mask 450 may include, e.g., spin-on-hard mask (SOH), an amorphous carbon layer (ACL), etc.

Figure 33:
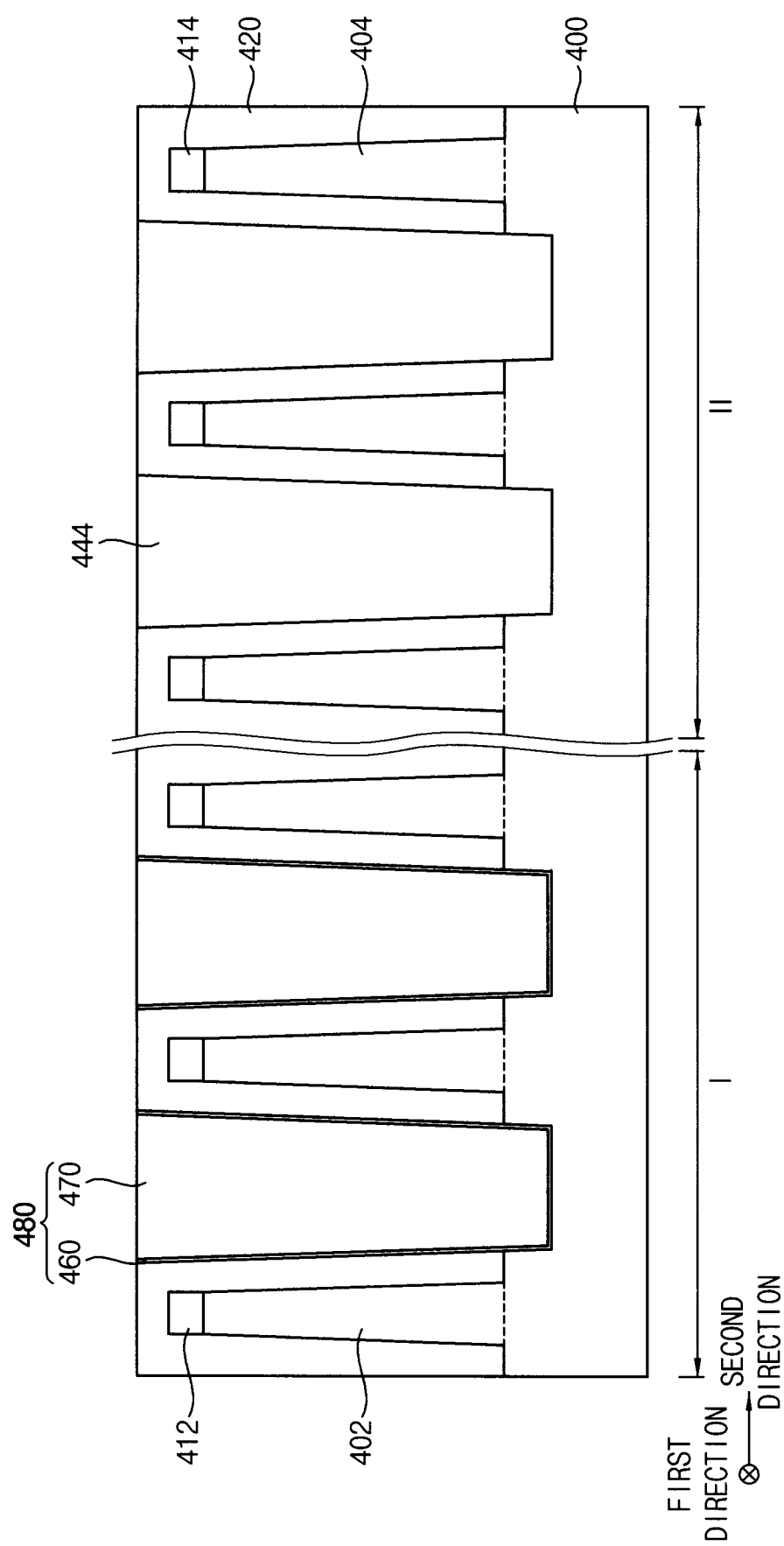

Referring to FIG. 33, after removing the second insulation pattern 442 to form again the second opening 432, a second liner 460 may be formed on an inner wall of the second opening 432, and a fourth insulation pattern 470 may be formed to fill a remaining portion of the second opening 432.

In example embodiments, the second liner 460 may include an oxide, e.g., silicon oxide, and the fourth insulation pattern 470 may include a nitride, e.g., silicon nitride.

The second liner 460 and the fourth insulation pattern 470 may form a first stress structure 480.

The first stress structure 480 may apply a compressive stress in the second direction to each of the second active fins 402, and thus a tensile stress may be applied to each of the second active fins 402 in the first direction. Accordingly, the mobility of charges in channels in each of the second active fins 402 may be increased.

Then, the fourth mask 450 may be removed. The fourth mask 450 may be removed by, e.g., an ashing process and/or a stripping process.

Figure 34:
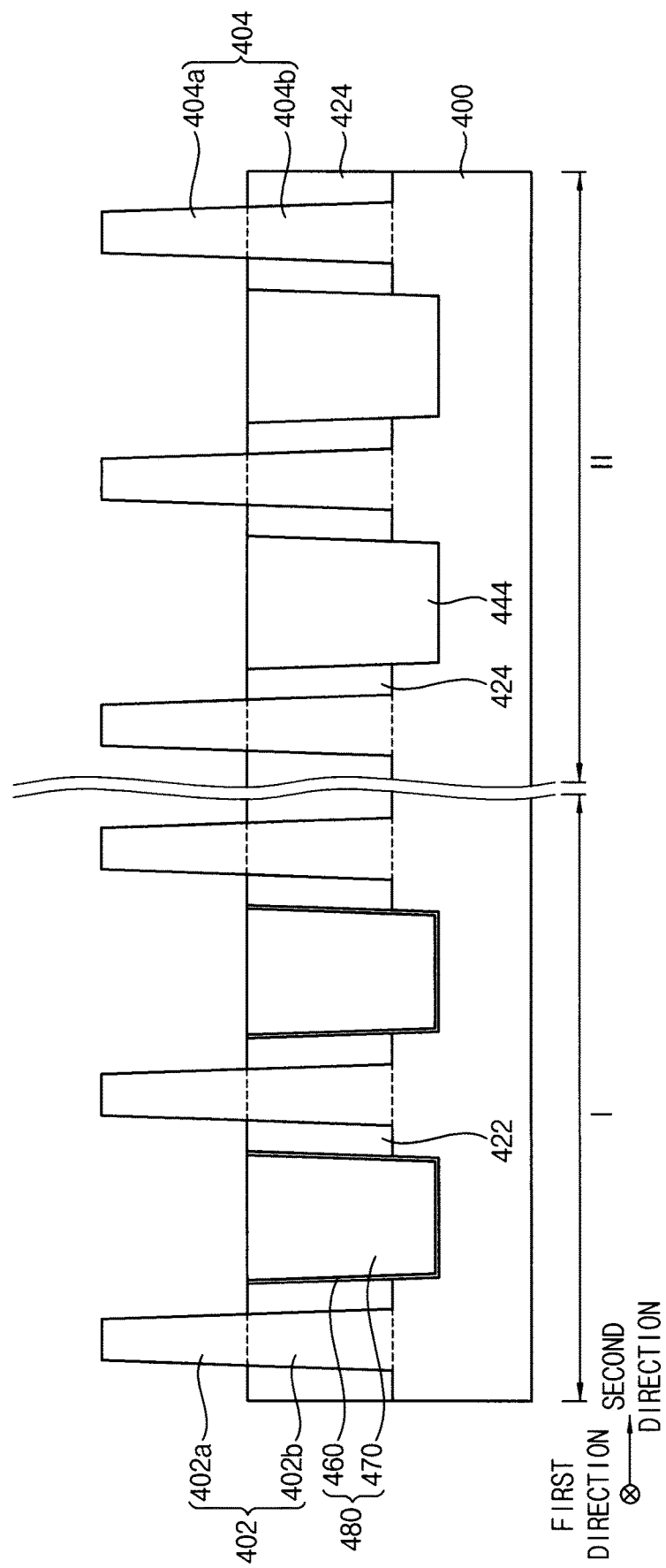

Referring to FIG. 34, upper portions of the first insulation layer 420, the first stress structure 480, and the third insulation pattern 444 may be removed to expose a second upper active pattern 402a of the second active fin 402 on the first region I of the substrate 400, and to expose a third upper active pattern 404a of the third active fin 404 on the second region II of the substrate 400.

A remaining portion of the first insulation layer 420 of which the upper portion is removed on the first region I of the substrate 400 may form a fifth insulation pattern 422, and a remaining portion of the first insulation layer 420 of which the upper portion thereof is removed on the second region II of the substrate 400 may form a sixth insulation pattern 424.

The first stress structure 480 in a lower portion of the second opening 432 may surround a sidewall of the second lower active pattern 402b of the second active fin 402, and may form a second isolation structure together with the fifth insulation pattern 422 contacting the sidewall of the second lower active pattern 402b. Also, the third insulation pattern 444 in a lower portion of the third opening 434 may surround a sidewall of the third lower active pattern 404b of the third active fin 404, and may form a third isolation structure together with the sixth insulation pattern 424 contacting the sidewall of the third lower active pattern 404b. As used herein, the term "contact" refers to direct contact (i.e., touching) unless the context indicates otherwise.

In some embodiments, the fifth insulation pattern 422 and the stress structure 480 may form a first isolation structure, where the second insulation pattern 422 fills a lower portion of the edge portion of the fifth recess 403, and the stress structure 480 fills a lower portion of the central portion of the fifth recess 403. The sixth insulation pattern 424 and the third insulation pattern 444 may form a second isolation structure, where the sixth insulation pattern 424 fills a lower portion of the edge portion of the sixth recess 405, and the third insulation pattern 444 fills a lower portion of the central portion of the second recess 405.

Figure 35:
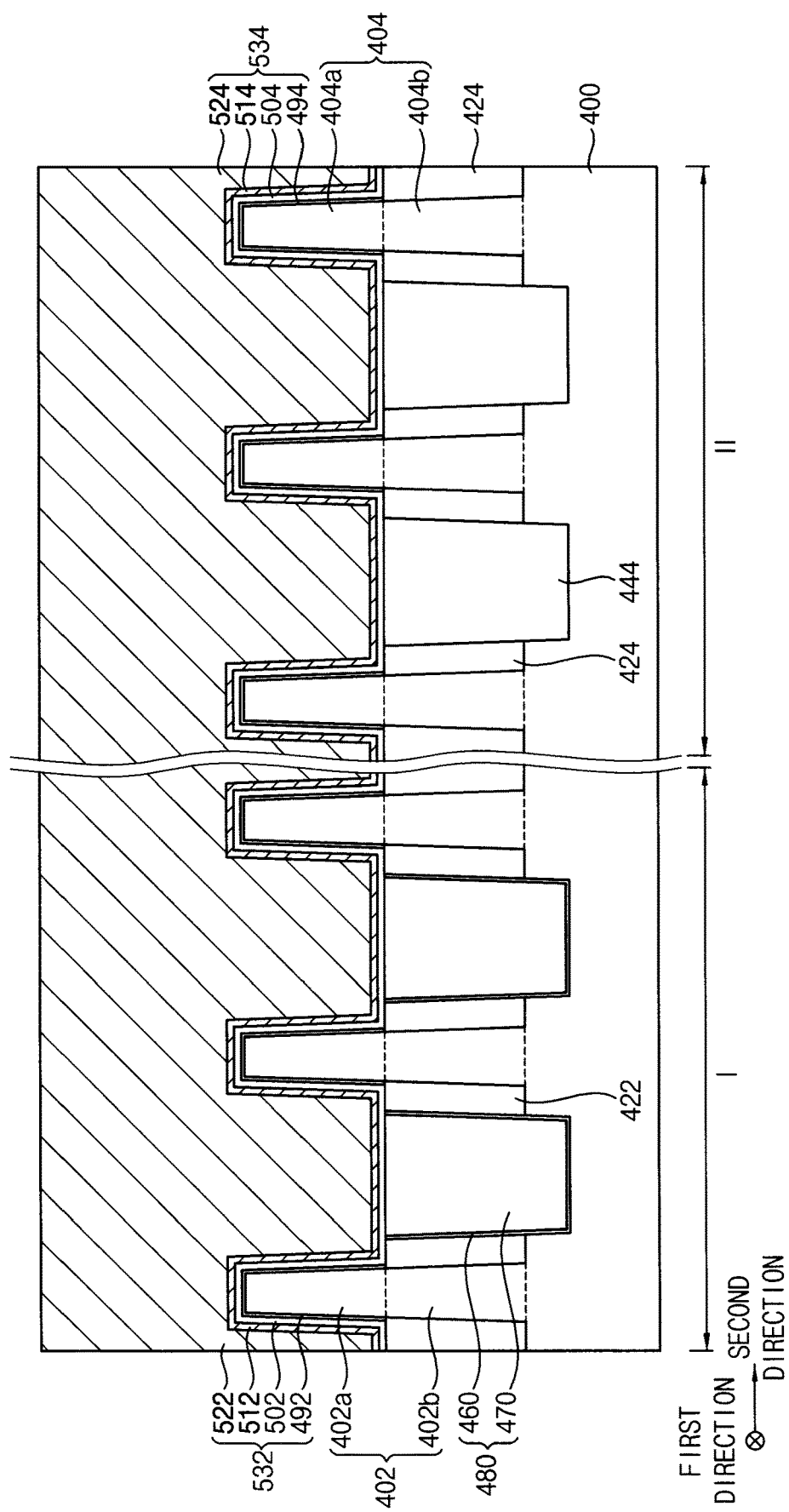

Referring to FIG. 35, processes substantially the same as or similar to the processes included illustrated in FIGS. 6 to 21 may be performed, so that a third gate electrode structure 532 and a third source/drain layer (not shown) on the second active fin 402 adjacent to the third gate electrode structure 532 may be formed on the first region I of the substrate 400, and a fourth gate electrode structure 534 and a fourth source/drain layer (not shown) on the third active fin 404 adjacent to the fourth gate electrode structure 532 may be formed on the second region II of the substrate 400.

The third gate electrode structure 532 may include a third interface pattern 492, a third gate insulation pattern 502, a third work function control pattern 512, and a third gate electrode 522 sequentially stacked, and the fourth gate electrode structure 534 may include a fourth interface pattern 494, a fourth gate insulation pattern 504, a fourth work function control pattern 415 and a fourth gate electrode 524.

The semiconductor device in accordance with example embodiments may include an NMOS transistor and a PMOS transistor on the first and second regions I and II, respectively, of the substrate 400, and since the second active fin 402 in which channels of the NMOS transistor may be formed may be subjected to tensile stress in the first direction by the first stress structure 480 including the second liner 460 and the fourth insulation pattern 470, the mobility of carriers in the channels, that is, charges may be increased so that the semiconductor device may have an improved performance.

When the fifth and sixth insulation patterns 422 and 424 are formed to have a thin thickness, similar to the semiconductor device manufactured by the processes illustrated in FIGS. 1 to 22, the second and third isolation structures may be hardly removed in a wet etching process for forming the third and fourth gate structures 532 and 534, respectively, and thus an electrical short between the third and fourth gate structures 532 and 534 and the third and fourth source/drain layers may be prevented.

Figure 36:
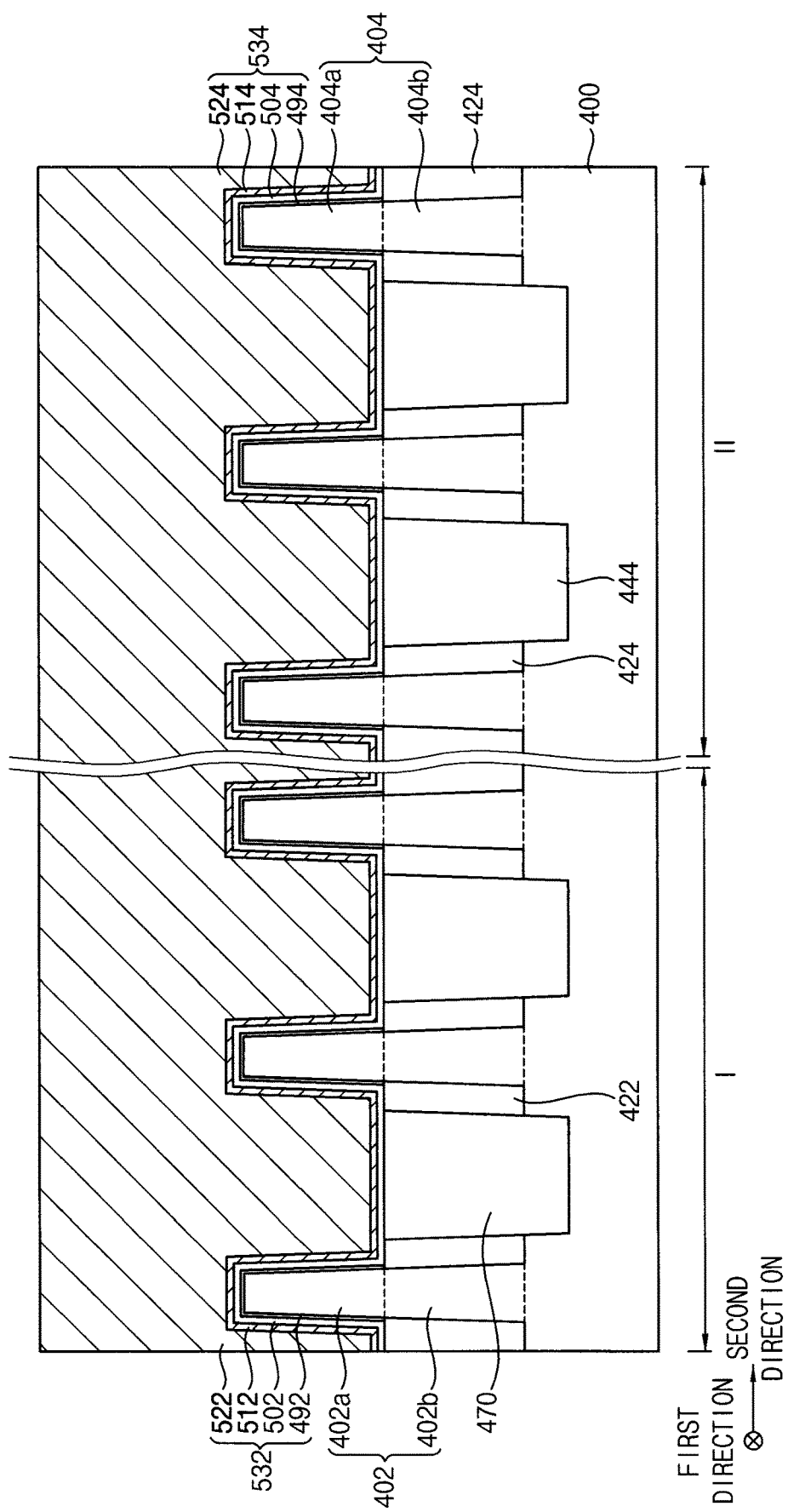
FIG. 36 is a cross-sectional view illustrating a semiconductor device in accordance with example embodiments.

FIG. 36 is a cross-sectional view illustrating a semiconductor device in accordance with example embodiments.

This semiconductor device is substantially the same as or similar to the semiconductor device illustrated in FIGS. 30 to 35, except for the second liner. Accordingly, like reference numerals refer to like elements, and detailed descriptions thereon are omitted herein.

Referring to FIG. 36, the second isolation structure covering the sidewall of the second lower active pattern 402b of the second active fin 402 on which the NMOS transistor may be formed on the first region I of the substrate 400 may include the fifth insulation pattern 422 and the fourth insulation pattern 470, but may not include the second liner 460.

This may be implemented by forming only the fourth insulation pattern 470 without forming the second liner 460 in the second opening 432, in the process illustrated in FIG. 33. In this case, only the fourth insulation pattern 370 may form the first stress structure 480, and in order to apply a desired degree of stress to the second active fin 402, the composition of the material included in the fourth insulation pattern 470 may be adjusted.

Figure 37:
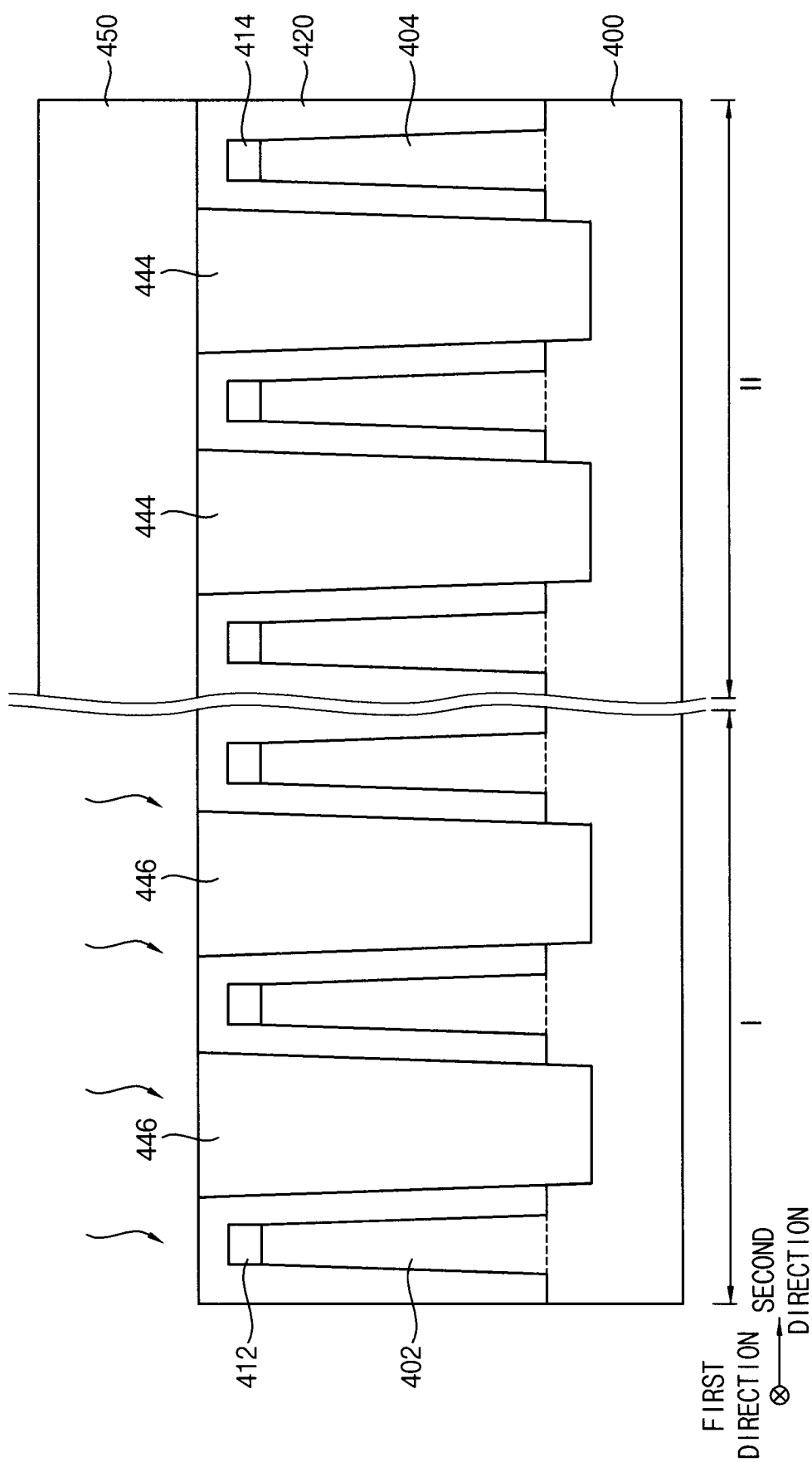
FIGS. 37 and 38 are cross-sectional views illustrating stages of a method of manufacturing a semiconductor device in accordance with example embodiments.
Figure 38:
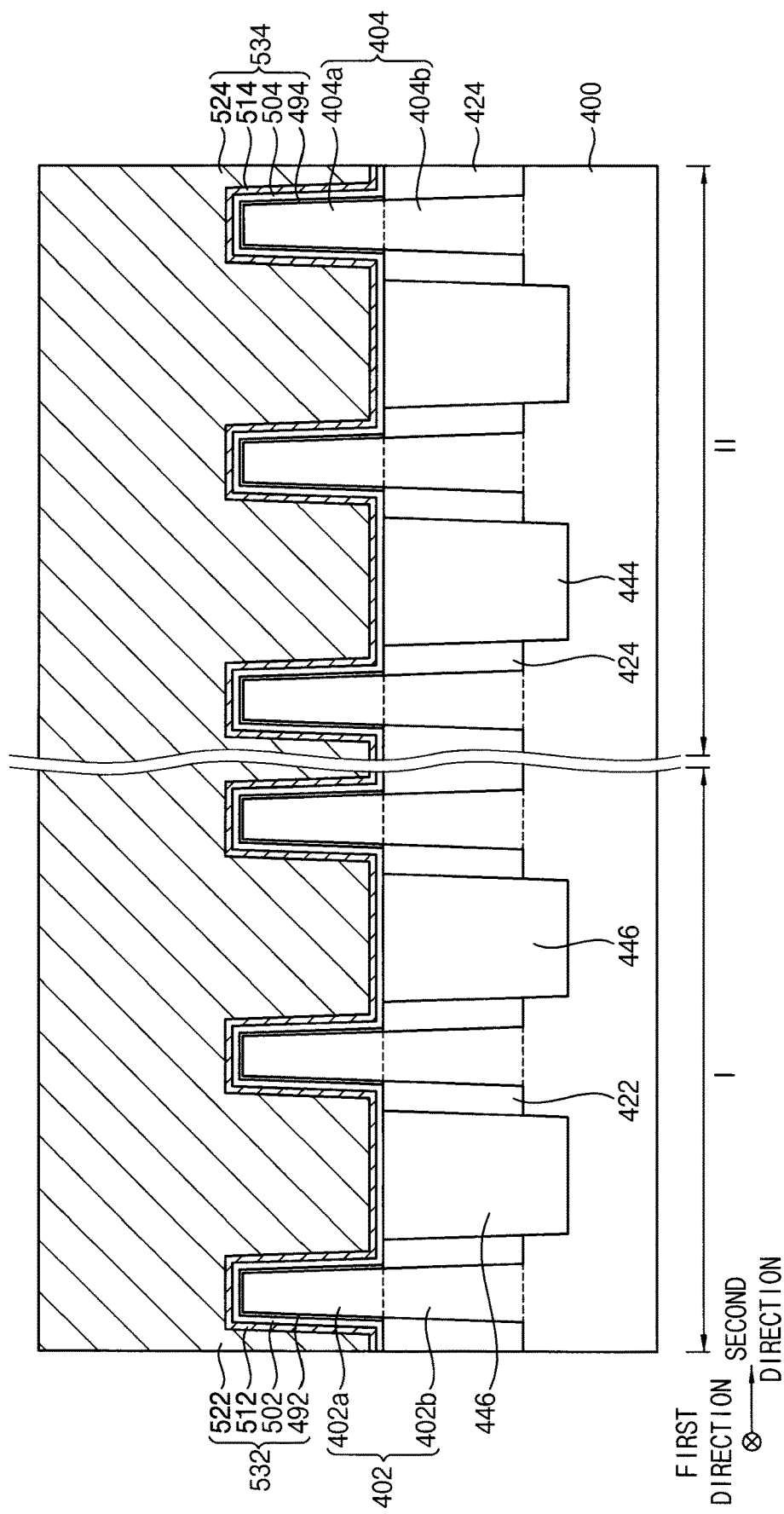

FIGS. 37 and 38 are cross-sectional views illustrating stages of a method of manufacturing a semiconductor device in accordance with example embodiments.

This method of manufacturing the semiconductor device includes processes substantially the same as or similar to the processes in the method illustrated in FIGS. 30 to 35, and thus detailed descriptions thereon are omitted herein Referring to FIG. 37, after performing processes substantially the same as or similar to the processes illustrated in FIGS. 30 to 32, a heat treatment process may be performed on the first region I of the substrate 400.

In example embodiments, the heat treatment process may be performed under an oxygen or hydrogen atmosphere. Accordingly, the physical properties of the second insulation pattern 442 may be changed and the second insulation pattern 442 may be converted into a seventh insulation pattern 446.

In example embodiments, the seventh insulation pattern 446 may apply a compressive stress in the second direction to the second active fins 402, and thus a tensile stress may be applied to a channel in the second active fins 402 in the first direction. Accordingly, the mobility of carriers in the channels, that is, charges in the channels, may be increased.

Referring to FIG. 38, after removing the fourth mask 450, processes substantially the same as or similar to the processes illustrated in FIGS. 34 to 35 may be performed to complete the fabrication of the semiconductor device.

In each of the NMOS and PMOS transistors included in the semiconductor device, an electrical short between the third and fourth gate electrode structures 532 and 534 and the third and fourth source/drain layers (not shown) adjacent thereto may be prevented.

The above semiconductor device may be applied to various types of memory devices and systems including finFETs. For example, the semiconductor device may be applied to logic devices such as central processing units (CPUs), main processing units (MPUs), or application processors (APs), or the like, including finFETs. Additionally, the semiconductor device may be applied to volatile memory devices such as DRAM devices or SRAM devices, or the like, or non-volatile memory devices such as flash memory devices, PRAM devices, MRAM devices, RRAM devices, or the like, which may include finFETs in peripheral circuit regions or cell regions.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A semiconductor device, comprising:
active fins spaced apart from each other by a recess therebetween, each of the active fins protruding from an upper surface of a substrate;
an isolation structure formed within the recess including:
a liner on a lower surface and a sidewall of a lower portion of the recess; and
a blocking pattern on the liner, the blocking pattern filling a remaining portion of the lower portion of the recess and including a nitride, a carbide, or polysilicon;
a gate electrode structure on the active fins and the isolation structure; and
a source/drain layer on a portion of each of the active fins adjacent to the gate electrode structure,
wherein each of the active fins extends lengthwise in a first direction substantially parallel to the upper surface of the substrate,
wherein the gate electrode structure extends lengthwise in a second direction substantially parallel to the upper surface of the substrate and intersecting with the first direction, and
wherein a first portion of the liner under the gate electrode structure has an uppermost surface lower than that of a second portion of the liner spaced apart from the first portion of the liner in the first direction.

2. The semiconductor device of claim 1, wherein the liner includes an oxide, and wherein the blocking pattern contacts the liner.

3. The semiconductor device of claim 1, further comprising:
a gate spacer covering a sidewall of the gate electrode structure,
wherein the source/drain layer is electrically insulated from the gate electrode structure by the gate spacer and the isolation structure.

4. The semiconductor device of claim 1, wherein the source/drain layer is formed on the portion of each of the active fins adjacent to the gate electrode structure in the first direction.

5. The semiconductor device of claim 1, wherein the uppermost surface of the first portion of the liner under the gate electrode structure is lower than an upper surface of the blocking pattern.

6. The semiconductor device of claim 1,
wherein each of the active fins includes a lower active pattern and an upper active pattern stacked on the lower active pattern, and
wherein the isolation structure covers a sidewall of the lower active pattern.

7. The semiconductor device of claim 6, wherein the gate electrode structure is formed on an upper surface and a sidewall of the upper active pattern and on an upper surface of the isolation structure.

8. The semiconductor device of claim 1, wherein the gate electrode structure includes an interface pattern on an upper surface of each of the active fins, and a gate insulation pattern, a work function control pattern, and a gate electrode sequentially stacked on the interface pattern and the isolation structure.

9. A semiconductor device, comprising:
an active fin protruding from an upper surface of a substrate and including a lower active pattern and an upper active pattern stacked on the lower active pattern;
an isolation structure including:
a liner on a sidewall of the lower active pattern and the upper surface of the substrate; and
a blocking pattern on the liner, the blocking pattern surrounding the sidewall of the lower active pattern and including a nitride, a carbide, or polysilicon;
a gate electrode structure on the upper active pattern and the isolation structure; and
a source/drain layer on a portion of the active fin adjacent to the gate electrode structure,
wherein an entire lower surface of the gate electrode structure is covered by the upper active pattern, the liner, and the blocking pattern, and wherein a first portion of the liner under the gate electrode structure has an uppermost surface lower than that of a second portion of the liner spaced apart from the first portion of the liner in a first direction substantially parallel to an upper surface of the substrate.

10. The semiconductor device of claim 9, wherein the liner includes a material different from that of the blocking pattern.

11. The semiconductor device of claim 9, further including:
a gate spacer covering a sidewall of the gate electrode structure,
wherein the source/drain layer is electrically insulated from the gate electrode structure by the gate spacer and the isolation structure.

12. The semiconductor device of claim 9,
wherein the active fin extends lengthwise in the first direction, and
wherein the gate electrode structure extends lengthwise in a second direction substantially parallel to the upper surface of the substrate and intersecting with the first direction.

13. The semiconductor device of claim 12, wherein the source/drain layer is formed on a portion of the active fin adjacent to the gate electrode structure in the first direction.

14. The semiconductor device of claim 9, wherein the uppermost surface of the first portion of the liner under the gate electrode structure is lower than an upper surface of the blocking pattern.

* * * * *